(12) United States Patent
Shimazawa et al.

(10) Patent No.: US 8,384,405 B2
(45) Date of Patent: Feb. 26, 2013

(54) METHOD FOR PERFORMING BURN-IN TEST

(75) Inventors: Koji Shimazawa, Tokyo (JP); Ryo Hosoi, Tokyo (JP); Yasuhiro Ito, Tokyo (JP); Masaaki Kaneko, Tokyo (JP); Takashi Honda, Hong Kong (HK); Ryuji Fujii, Hong Kong (HK); Koji Hosaka, Hong Kong (HK)

(73) Assignee: TDK Corporation, Tokyo (JP)

( * ) Notice: Subject to any disclaimer, the term of this patent is extended or adjusted under 35 U.S.C. 154(b) by 36 days.

(21) Appl. No.: 13/090,902

(22) Filed: Apr. 20, 2011

(65) Prior Publication Data

US 2012/0269047 A1  Oct. 25, 2012

(51) Int. Cl.
*G01R 31/308* (2006.01)

(52) U.S. Cl. ......... 324/754.23; 324/750.05; 324/750.08; 324/754.04; 324/760.01; 324/761.01; 324/762.07

(58) Field of Classification Search ............. 324/750.05, 324/750.08, 754.04, 760.01, 761.01, 762.07, 324/754.23
See application file for complete search history.

(56) References Cited

U.S. PATENT DOCUMENTS

| | | | | | |
|---|---|---|---|---|---|
| 5,272,434 | A | * | 12/1993 | Meyrueix et al. | 324/754.23 |
| 5,406,213 | A | * | 4/1995 | Henley | 324/760.01 |
| 5,444,385 | A | * | 8/1995 | Henley | 324/750.22 |
| 6,222,647 | B1 | * | 4/2001 | Tadenuma et al. | 358/475 |
| 6,259,244 | B1 | * | 7/2001 | Wakana et al. | 324/96 |
| 6,356,259 | B1 | * | 3/2002 | Maeda et al. | 345/173 |
| 6,750,926 | B2 | * | 6/2004 | Ohgiichi et al. | 349/40 |
| 7,196,782 | B2 | * | 3/2007 | Fielden et al. | 356/72 |
| 7,221,830 | B2 | * | 5/2007 | Onozeki et al. | 385/52 |
| 7,250,778 | B2 | * | 7/2007 | Feng | 324/754.07 |
| 7,538,978 | B2 | | 5/2009 | Sato et al. | |
| 7,663,385 | B2 | * | 2/2010 | Kamieniecki | 324/754.23 |
| 7,795,885 | B2 | * | 9/2010 | Gorczyca et al. | 324/754.23 |
| 7,804,655 | B2 | * | 9/2010 | Shimazawa et al. | 360/59 |
| 7,821,732 | B2 | * | 10/2010 | Komura et al. | 360/59 |
| 7,876,646 | B2 | * | 1/2011 | Tanaka et al. | 369/13.02 |
| 7,924,658 | B2 | * | 4/2011 | Shimazawa et al. | 369/13.14 |
| 7,936,531 | B2 | * | 5/2011 | Tomikawa et al. | 360/59 |
| 7,940,486 | B2 | * | 5/2011 | Shimazawa et al. | 360/59 |
| 7,957,085 | B2 | * | 6/2011 | Tanaka et al. | 360/59 |
| 7,974,043 | B2 | * | 7/2011 | Shimazawa et al. | 360/125.31 |
| 8,018,685 | B2 | * | 9/2011 | Shimazawa et al. | 360/245.3 |

(Continued)

OTHER PUBLICATIONS

Hale et al. "Optical Constants of Water in the 200 nm to 200 um Wavelength Region", Applied Optics, vol. 12, No. 3, Mar. 1973, pp. 555-563.*

(Continued)

*Primary Examiner* — Patrick Assouad
*Assistant Examiner* — Lamarr Brown
(74) *Attorney, Agent, or Firm* — Posz Law Group, PLC

(57) ABSTRACT

A method of the invention for performing burn-in test includes assembling, on a fixture stand, a plurality of light source elements and a plurality of light detectors for monitoring a light output from a corresponding one of the plurality of light source elements; and electrifying the plurality of light source elements in a state where at least the plurality of light source elements and the plurality of light detectors are immersed in an insulation liquid. Thereby, it is realized to hold a stable temperature in a short period of time, to maintain a temperature that does not deviate from normal load conditions, and to perform a sorting test between defect parts and good part for light source unit chips without causing damage to the elements.

10 Claims, 11 Drawing Sheets

U.S. PATENT DOCUMENTS

| | | | | |
|---|---|---|---|---|
| 8,065,786 | B2* | 11/2011 | Shimazawa et al. | 29/603.12 |
| 8,077,556 | B2* | 12/2011 | Komura et al. | 369/13.02 |
| 8,094,523 | B2* | 1/2012 | Kamijima et al. | 369/13.33 |
| 8,149,653 | B2* | 4/2012 | Shimazawa et al. | 369/13.33 |
| 8,179,747 | B1* | 5/2012 | Mugino et al. | 369/13.33 |
| 8,194,509 | B2* | 6/2012 | Shimazawa et al. | 369/13.33 |
| 8,232,817 | B2* | 7/2012 | Kamieniecki | 324/754.23 |
| 8,240,025 | B2* | 8/2012 | Shimazawa et al. | 29/603.14 |
| 8,243,388 | B2* | 8/2012 | Shimazawa et al. | 360/125.74 |
| 8,248,892 | B2* | 8/2012 | Shimazawa et al. | 369/13.32 |
| 8,248,895 | B2* | 8/2012 | Shimazawa et al. | 369/13.33 |
| 8,250,737 | B2* | 8/2012 | Shimazawa et al. | 29/603.07 |
| 8,254,214 | B2* | 8/2012 | Shimazawa et al. | 369/13.33 |
| 2002/0194911 | A1* | 12/2002 | Allegre et al. | 73/293 |
| 2003/0128626 | A1* | 7/2003 | Verkerk | 366/140 |
| 2004/0264872 | A1* | 12/2004 | Onozeki et al. | 385/52 |
| 2006/0036348 | A1* | 2/2006 | Handique et al. | 700/266 |
| 2007/0164776 | A1* | 7/2007 | Chang et al. | 324/770 |
| 2007/0273400 | A1* | 11/2007 | Kamieniecki | 324/765 |
| 2008/0043360 | A1* | 2/2008 | Shimazawa et al. | 360/59 |
| 2008/0055762 | A1* | 3/2008 | Shimazawa et al. | 360/59 |
| 2008/0055763 | A1* | 3/2008 | Tanaka et al. | 360/59 |
| 2008/0055784 | A1* | 3/2008 | Shimazawa et al. | 360/313 |
| 2008/0056073 | A1 | 3/2008 | Shimizu | |
| 2008/0158709 | A1* | 7/2008 | Tanaka et al. | 360/59 |
| 2008/0192376 | A1* | 8/2008 | Tanaka et al. | 360/59 |
| 2008/0205202 | A1* | 8/2008 | Komura et al. | 369/13.02 |
| 2009/0052078 | A1 | 2/2009 | Tanaka et al. | |
| 2009/0262448 | A1* | 10/2009 | Shimazawa et al. | 360/59 |
| 2009/0266789 | A1* | 10/2009 | Shimazawa et al. | 216/22 |
| 2010/0073802 | A1* | 3/2010 | Komura et al. | 360/59 |
| 2010/0074062 | A1* | 3/2010 | Kamijima et al. | 369/13.14 |
| 2010/0085846 | A1* | 4/2010 | Shimazawa et al. | 369/13.14 |
| 2010/0097724 | A1* | 4/2010 | Shimazawa et al. | 360/245.4 |
| 2010/0103553 | A1* | 4/2010 | Shimazawa et al. | 360/59 |
| 2010/0118431 | A1* | 5/2010 | Tomikawa et al. | 360/59 |
| 2010/0156445 | A1* | 6/2010 | Kamieniecki | 324/752 |
| 2010/0225916 | A1* | 9/2010 | Nakahara et al. | 356/436 |
| 2010/0237896 | A1* | 9/2010 | Ohgiichi et al. | 324/770 |
| 2010/0238580 | A1* | 9/2010 | Shimazawa et al. | 360/59 |
| 2011/0026377 | A1* | 2/2011 | Shimazawa et al. | 369/13.24 |
| 2011/0046035 | A1* | 2/2011 | Maessen et al. | 510/171 |
| 2011/0122737 | A1* | 5/2011 | Shimazawa et al. | 369/13.24 |
| 2011/0128827 | A1* | 6/2011 | Shimazawa et al. | 369/13.02 |
| 2011/0157738 | A1* | 6/2011 | Shimazawa et al. | 360/59 |
| 2011/0228649 | A1* | 9/2011 | Shimazawa et al. | 369/13.24 |
| 2011/0228653 | A1* | 9/2011 | Shimazawa et al. | 369/13.32 |
| 2011/0242697 | A1* | 10/2011 | Mori et al. | 360/59 |
| 2011/0267087 | A1* | 11/2011 | Huang | 324/754.23 |
| 2012/0008470 | A1* | 1/2012 | Shimazawa et al. | 369/13.24 |
| 2012/0044790 | A1* | 2/2012 | Shimazawa et al. | 369/13.32 |
| 2012/0073120 | A1* | 3/2012 | Shimazawa et al. | 29/603.07 |
| 2012/0090162 | A1* | 4/2012 | Shimazawa et al. | 29/603.01 |
| 2012/0139566 | A1* | 6/2012 | Shimazawa et al. | 324/750.01 |
| 2012/0147717 | A1* | 6/2012 | Shimazawa et al. | 369/13.33 |
| 2012/0165759 | A1* | 6/2012 | Rogers et al. | 604/264 |

OTHER PUBLICATIONS

Nakamura et al., "Micro-rheometry of pressurized lubricants and micro-nanorheology", Springer-Verlag (2005), pp. 1127-1131.*

U.S. Appl. No. 12/958,692, filed Aug. 10, 2010.

* cited by examiner

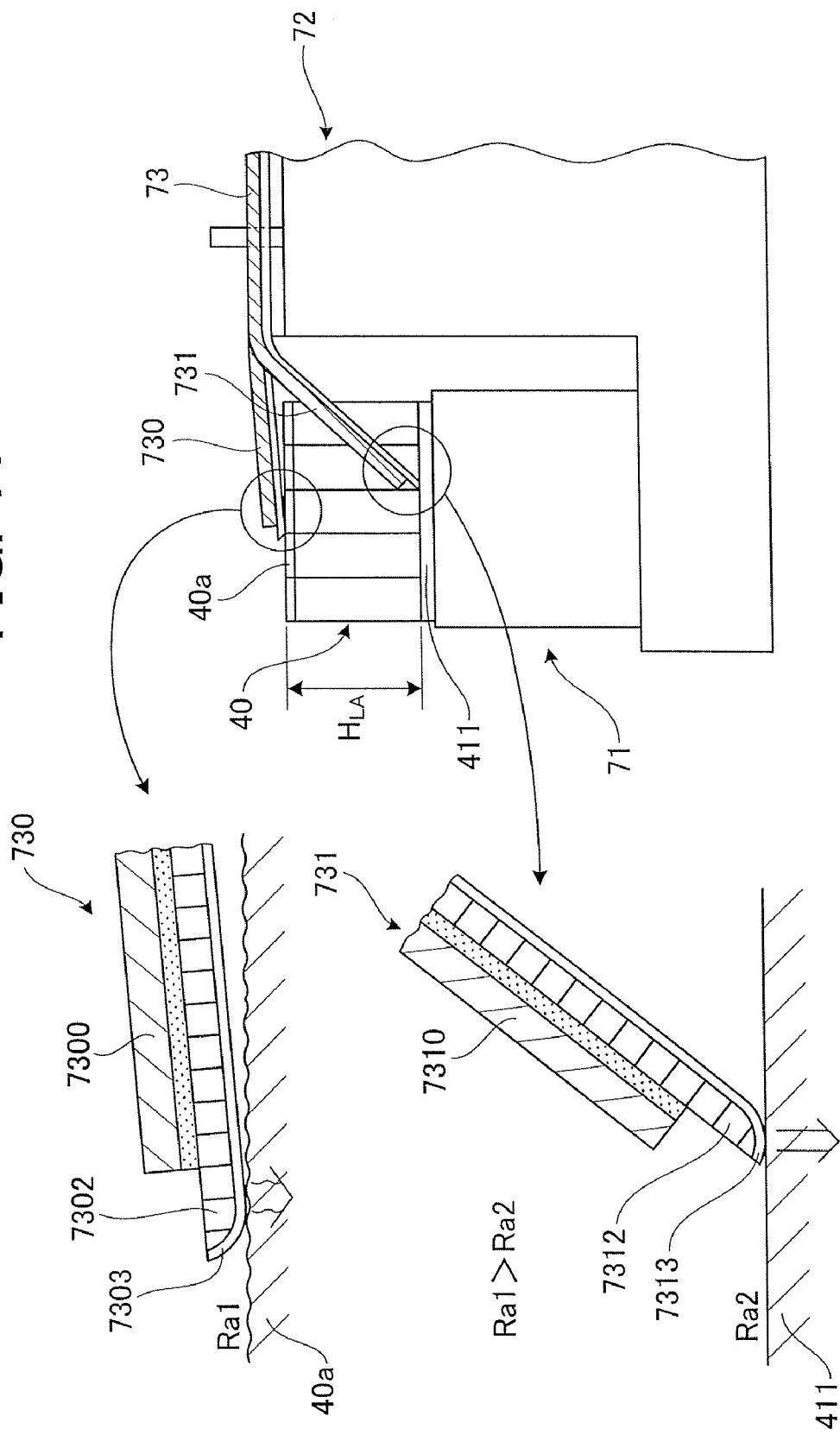

METHOD FOR PERFORMING BURN-IN TEST

BACKGROUND OF THE INVENTION

1. Field of the Invention

The present invention relates to a method for performing a burn-in test which is an effective conductivity test for screening elements. In particular, the present invention relates to a method for performing a burn-in test for a light source unit that is provided with a light source for thermally-assisted magnetic recording.

2. Description of the Related Art

In the field of magnetic recording using a head and a medium, further improvements have been demanded in performance of thin film magnetic heads and magnetic recording media in view of an increase in recording density of magnetic disk devices. For the thin film magnetic heads, composite type thin film magnetic heads configured from lamination of a reading magnetoresistive (MR) element and a writing electromagnetic conversion element are being widely used.

The magnetic recording medium is a non-continuous medium, in which magnetic particles are aggregated. Each magnetic particle has a single magnetic domain. In this magnetic recording medium, a single recording bit is configured by a plurality of magnetic particles. Therefore, to increase magnetic density, the size of the magnetic particles must be reduced, and asperity at a border of adjacent recording bits needs to be minimized. However, if the size of the magnetic particles is reduced, there is a problem that thermal stability for magnetization of the magnetic particles is lowered as the volume of the magnetic particles is reduced.

To address this problem, increasing magnetic anisotropic energy Ku of magnetic particles may be considered. However, this increase in Ku causes an increase in anisotropic magnetic field (coercive force) of the magnetic recording medium. On the other hand, the upper limit of the writing magnetic field intensity for the thin film magnetic head is determined substantially by saturation magnetic flux density of a soft magnetic material forming a magnetic core in the head. As a result, when the anisotropic magnetic field of the magnetic recording medium exceeds an acceptable value determined from the upper value of the writing magnetic field intensity, writing becomes impossible. Currently, as a method to solve such a problem of thermal stability, a so-called thermally assisted magnetic recording method has been proposed, which, using a magnetic recording medium formed by a magnetic material with large Ku, performs the writing by heating the magnetic recording medium immediately before applying the writing magnetic field to reduce the anisotropic magnetic field.

For this thermally assisted magnetic recording method, a method that uses a near-field light probe, a so-called plasmon antenna, which is a piece of metal that generates near-field light from plasmon excited by emission of laser light, is known.

With this type of thermally-assisted magnetic recording, a major issue is where and how a high output light source is installed in a magnetic head in order to provide sufficiently high intensity light stably at a desired position.

Concerning placement of the light source, U.S. Pat. No. 7,538,978 B2 discloses a structure that contains a laser unit including a laser diode on a rear side of a slider. US Patent Publication No. 2008/0056073 A1 discloses a structure in which a structural body is mounted on an edge surface (or rear side) of a slider, the structural being that a reflective mirror is monolithically integrated on a laser diode element.

Furthermore, the inventors of the present application propose a thermally-assisted magnetic recording head for a so-called "composite slider structure" that is configured to connect a light source unit provided with a light source to an end surface (back surface) on a side opposite to an air bearing surface (ABS) of a slider that provides a magnetic head element.

This type of "composite slider structure" is disclosed, for example, in US Patent Publication No. 2008/0043360 A1 and US Patent Publication No. 2009/0052078 A1.

Furthermore, a thermally-assisted magnetic recording head of a "composite slider structure" has the following advantages (1)-(4):

(1) The air bearing surface and the integrated surface in the slider are perpendicular, and therefore have good compatibility to a conventional thin-film magnetic head manufacturing process;

(2) The light source can be far from the air bearing surface, and conditions that cause direct mechanical impact to the light source during the operation can be avoided;

(3) Because optical components that require extremely high precision, such as an optical pickup lens, and optical components that require a special structure for connecting, such as optic fiber or the like, are not required within the head, the number of manufacturing steps can be reduced, and cost will be lower; and (4) With regards to a property evaluation and a reliability evaluation during the manufacturing process, the laser diode, which is the light source, and the magnetic head element can be independently evaluated. As a result, a situation can be avoided where the yield for the light source and the yield for the slider have an additive effect, such as when the light source and the magnetic head element are all provided within the slider, and cause the yield of the entire head to dramatically decrease.

Herein, a reliability evaluation for a light source unit provided with a laser diode is particularly considered. Performing a burn-in test is effective for reliability evaluation of this type of light source. Herein, a burn-in test is a test for screening test subjects by electrifying a test subject (herein a laser diode provided on a light source unit), measuring the over time change of one property of the test subject at high temperature (for example, under heating conditions at 80° C.) while maintaining the electrification, and evaluating the over time change of the property.

However, this type of burn-in test requires an extremely long time, such as from several hours to several tens of hours, in order to evaluate a single laser diode.

Therefore, as a countermeasure, evaluating a plurality of laser diodes in parallel in a bar condition prior to cutting and separating into individual light source chips in the light source manufacturing process is very effective. By performing this type of parallel processing, a burn-in test for a large number of laser diodes can be performed at one time, and the number of evaluation processes and the time can be greatly reduced.

However, simultaneously contacting a power supply probe to a large quantity of electrodes for a plurality of laser diodes placed in a bar is extremely difficult. Furthermore, even if a power supply probe can simultaneously contact with a large quantity of electrodes for a plurality of laser diodes as a result of an innovation in the configuration of the bar or the like for example, the following problems occur.

Namely, if the bar length is 80 mm, for example, it is thought that 100 to 200 laser diodes (LD chips) can be present in a single bar.

A laser diode having a light output of approximately 100 mW is typically used. Herein, the input power is generally approximately 3 times the light output, and in this case, 200 mW is converted to Joule heat. Assuming that 100 elements are simultaneously made to emit, an amount of heat corresponding to 20 W is concentrated in a bar with a small volume that contains the LD chips.

If such heat is not effectively dissipated to a fixture that contacts with the bar, the deviate of the LD chip temperature with regards to the test environment temperature is severe, and problems occurs in that an accurate evaluation is not possible. There is concern that, in the worst case, large thermal stress is applied to the LD chip, and the chip itself is destroyed.

Therefore, it is conceivable to make structural improvements in order to dissipate the heat to the fixture that contacts the bar. However, the structure of the fixture that incorporates the bar or the like becomes complex.

The present invention is conceived based on this situation, and an object thereof is to propose a method for performing a burn-in test and a test device that maintains a simple device structure while holding a stable temperature in a short period of time and maintaining a temperature that does not deviate from normal load conditions, and that performs a sorting test between defect parts and good parts for light source unit chips without causing damage to the element.

SUMMARY

In conceiving the present invention, the present inventors considers that, in order to simplify the simultaneous contacting of a power supply probe to a large quantity of electrodes, it would be extremely significant to prepare a light source element arrangement bar formed with conceived improvisations, to arrange light source unit chips in order on the light source element arrangement bar where individual light source unit chips are cut from the bar condition, and to simultaneously contact the power supply probe to a large quantity of electrodes for the plurality of laser diodes placed on the light source element arrangement bar. Furthermore, the present inventors considers that the burn-in test could easily be performed at one time on a large quantity of laser diodes and the number of evaluation processes and time could be greatly reduced by performing parallel processing of the plurality of light source unit chips in this manner. Therefore, the present inventor filed U.S. patent application Ser. No. 12/958,692 (filing date: Aug. 10, 2010).

The present invention further develops the previously filed invention, and as described above, proposes a method for performing a burn-in test that prevents a large amount of heat from concentrating in the small volume light source element arrangement bar containing LD chips, that holds a stable temperature in a short period of time, that maintains a temperature that does not deviate from normal load conditions, and that performs a sorting test between defect parts and good part for light source unit chips without causing damage to the elements.

Namely, a method of the invention for performing burn-in test is configured to include assembling, on a fixture stand, a plurality of light source elements and a plurality of light detectors for monitoring a light output from a corresponding one of the plurality of light source elements; and electrifying the plurality of light source elements in a state where at least the plurality of light source elements and the plurality of light detectors are immersed in an insulation liquid.

In a preferred embodiment of the method of the invention for performing burn-in test, the insulation liquid is configured to include physical properties having a transmissivity of 99.9% or higher at a thickness of 1 mm for light with a wavelength between 600 and 1000 nm.

In a preferred embodiment of the method of the invention for performing burn-in test, the insulation liquid receives stirring action.

In a preferred embodiment of the method of the invention for performing burn-in test, the plurality of light source elements are arranged in a row on a light source element arrangement bar which is a substrate, and each of the plurality of light detectors is arranged opposite to an emission surface of the corresponding one of the plurality of light source elements.

In a preferred embodiment of the method of the invention for performing burn-in test, the plurality of light source elements arranged in the row on the light source element arrangement bar are each configured as a light source unit for thermally-assisted magnetic recording that includes a laser diode which is a light source element provided on a unit substrate, by dividing the plurality of light source elements into single units each containing the light source element.

In a preferred embodiment of the method of the invention for performing burn-in test, the light source elements are laser diodes, and the light detectors are photodiodes.

In a preferred embodiment of the method of the invention for performing burn-in test, the laser diode includes an upper electrode and a lower electrode, the light source element arrangement bar includes an extraction lower electrode that is electrically connected to the lower electrode of the laser diode, a sheet probe for the upper electrode and a sheet probe for the lower electrode are made to respectively contact the upper electrode and the extraction lower electrode, and the laser diode is electrified through a pair of the upper electrode and the sheet probe for the upper electrode and a pair of the extraction lower electrode and the sheet probe for the lower electrode.

In a preferred embodiment of the method of the invention for performing burn-in test, the method includes electrifying the laser diode, and measuring an over time change of current supplied to the laser diode that is required to obtain a predetermined light output from the laser diode.

A device for performing the method for performing burn-in test is configured to include; a fixture stand that fixes the light detectors in a configuration opposite to the emission surface of the light source elements; a sheet probe set in which sheet probes for upper electrodes and sheet probes for lower electrodes are alternatingly arranged; a controller that receives a measurement output from the light detectors, that controls current supplied to the light detector, and that measures the current; and a container body that is configured to accommodate the fixture stand and to store the insulation liquid. Wherein, the fixture stand detachably fixes the light source element arrangement bar on which the light source elements are arranged, and by storing the insulation liquid in the container body, the light source elements and the light detectors that are attached to the fixture stand are immersed in the insulation liquid.

BRIEF DESCRIPTION OF THE DRAWINGS

FIG. 11 is a schematic view for describing a condition of contact between each electrode and the sheet probe that is used in the burn-in test.

DESCRIPTION OF THE PREFERRED EMBODIMENTS

A form for implementing the present invention is described below in detail while referring to the attached drawings.

Before describing the method for performing a burn-in test of the present invention, a description will be given of the structure of a thermally-assisted magnetic recording head that preferably uses a light source element that is the subject of the burn-in test.

Before explaining the present invention, terminologies used in the present specification are defined. In a lamination structure of an element structure formed on an element formation surface of a slider substrate of a magnetic recording head according to embodiments of the present invention, from a reference layer or element, the substrate side is called "downward (lower direction)," and the opposite side is called "upward (upper direction)." In addition, in the magnetic recording head according to embodiments of the present invention, some of the drawings provide "X, Y and Z axis directions" if necessary. Here, the Z axis direction is the above-described "up and down directions."+Z side corresponds to a trailing side, and −Z side corresponds to a leading side. Moreover, the Y axis direction is a track width direction.

In each of the drawings, identical elements are illustrated using identical reference numbers. Furthermore, the respective dimensional ratios between component elements and within component elements in the diagrams are arbitrary, in order to simplify viewing of the diagram.

Figure 1:
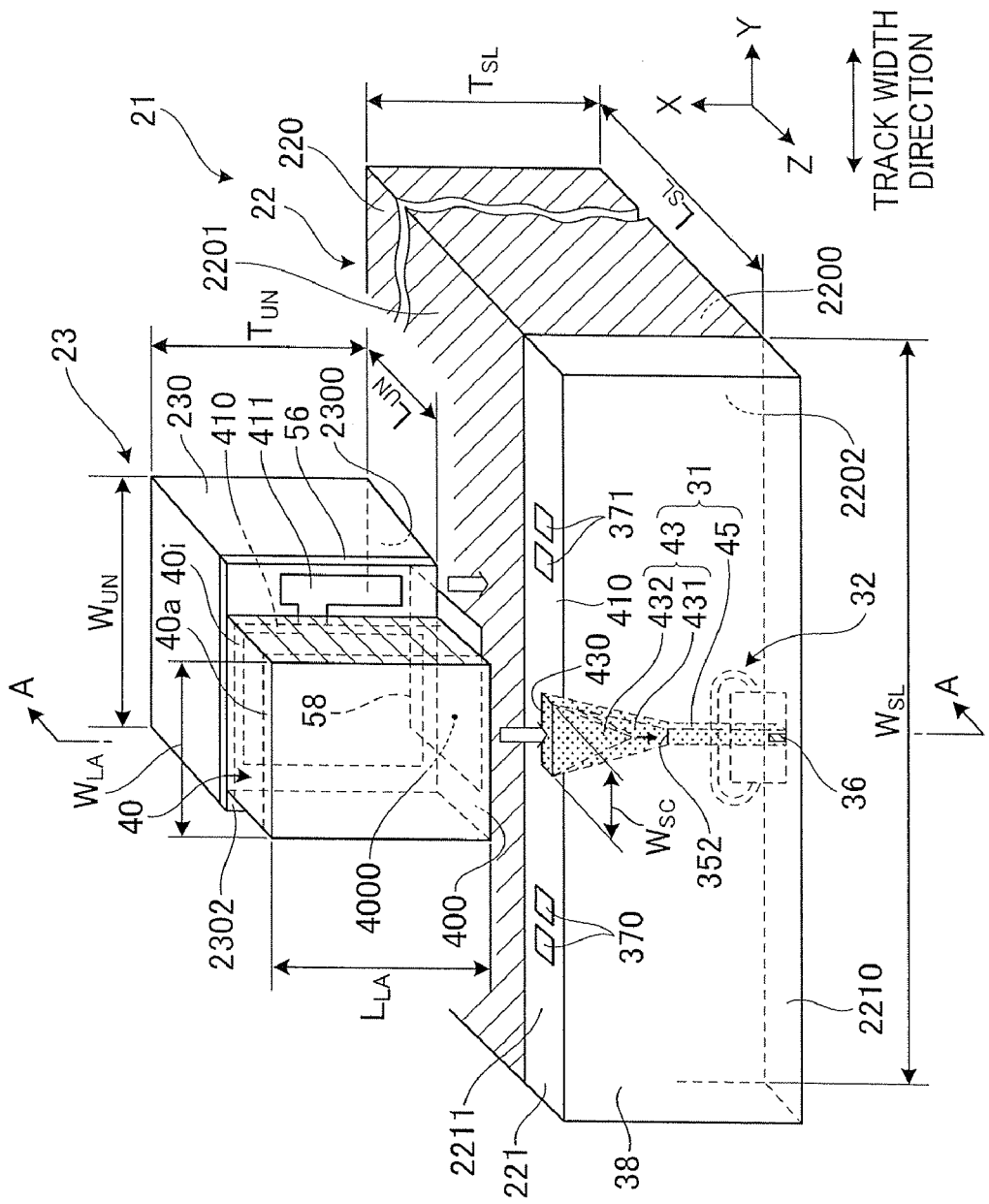
FIG. 1 is a perspective view illustrating an embodiment of a thermally-assisted magnetic recording head of the present invention.

FIG. 1 is a perspective view illustrating an embodiment of a thermally-assisted magnetic recording head that preferably uses a light source element that is the subject of the burn-in test of the present invention.

As illustrated in FIG. 1, a thermally-assisted magnetic recording head 21 is configured by aligning positions and connecting a light source unit 23 provided with a laser diode 40 which is a light source element that is a light source for thermal assistance, and a slider 22 provided with an optical system 31.

The slider 22 includes a slider substrate 220 having a flying surface 2200, which is an air bearing surface (ABS), processed so as to achieve a suitable flying height, and a head element part 221 including an optical system 31, formed on an integrated surface 2202 adjacent to, and perpendicular to, the ABS 2200.

The light source unit 23 includes a unit substrate 230 having an adhesion surface 2300, and a laser diode 40, which is a light source element, provided on a light source installation surface 2302 adjacent to, and perpendicular to, the adhesion surface 2300.

The slider 22 and the light source unit 23 are adhered with each other in a form such that a back surface 2201 on a side opposite of the ABS 2200 of the slider substrate 220 opposes the adhesion surface 2300 of the unit substrate 230, with a solder layer 58, which is an adhesion layer, interposed therebetween.

(Description of Light Source Unit 23)

In the light source unit 23 illustrated in FIG. 1, the laser diode 40, which is the light source element, is not restricted to that element configuration, but is preferably an end surface emission type semiconductor laser diode. The end surface emission type semiconductor laser diode 40 includes an emission center 4000 that radiates laser light for thermal assistance, and is installed on the light source installation surface 2302 of the unit substrate 230 such that the emission center 4000 opposes a light receiving end surface 430 of a spot size converter element 43.

Furthermore, the laser diode 40 is preferably adhered to the unit substrate 230 with a p-electrode 40i (see FIG. 2) on the bottom (facing the light source installation surface 2302). Generally, with an end surface emission type semiconductor laser diode, the region of an active layer (emission center) that generates the most heat is located closer to the p-electrode side. Therefore, by placing the p-electrode 40i on the bottom, the active layer is closer to the unit substrate 230, and as a result, the unit substrate 230 can more effectively function as a heat sink.

In this manner, if the laser diode 40 is installed with the p-electrode 40i on the bottom, the upper surface of the laser diode 40 is the surface of an n-electrode 40a (see FIG. 2) as an upper electrode. Herein, in the burn-in test for the laser diode 40 that is described below, the sheet probe preferably contacts the n-electrode 40a.

Furthermore, as illustrated in FIG. 1, a configuration where a light source electrode 410 and an extraction electrode 411 are provided on the light source installation surface 2302 of the light source unit 23 is preferable. The light source electrode 410 is an electrode that is directly electrically connected to the p-electrode 40i (see FIG. 2) of the laser diode 40.

The extraction electrode 411 is a lower electrode that is extracted from the light source electrode 410, and is an electrode that contacts with the sheet probe during the burn-in test for the laser diode 40 that is described below. The surface roughness Ra of the extraction electrode 411 which is the lower electrode is preferably set to a value smaller than the surface roughness Ra of the n-electrode 40a which is the upper electrode, as described later as a preferred form.

The n-electrode 40a of the laser diode 40 and the extraction electrode 411 are electrically connected to a connection pad of a wiring member 203 of a head gimbal assembly (HGA) 17 (see FIG. 5) using a method such as wire bonding or solder ball bonding (SBB) or the like, and thereby is configured such that power is supplied to the laser diode 40.

The light source electrode 410 and the extraction electrode 411 are preferably provided on an insulation layer 56 formed from an insulation material, such as $Al_2O_3$ (alumina), $SiO_2$ or the like, provided on the light source installation surface 2302, and preferably are electrically insulated from the unit substrate 230.

Such light source electrode 410 and extraction electrode 411 are preferably configured from an under layer composed of Ta, Ti or the like with a thickness of approximately 10 nm (nanometers) formed using a sputtering method, a vapor deposition method or the like for example, and a conductive layer composed of a conductive material, such as Au, Cu, or Au alloy or the like, with a thickness of approximately 1 to 5 μm (micrometers) for example, formed on the under layer using a sputtering method, plating method, vapor deposition method, or the like for example.

Furthermore, as illustrated in FIG. 1, the unit substrate 230 can be formed of a ceramic material, such as AlTiC ($Al_2O_3$—TiC), $SiO_2$ or the like, and is preferably formed of a semiconductor material, such as Si, GaAs, SiC or the like. If the unit substrate 230 is formed of these semiconductor materials, light such as Nd—YAG laser light can be irradiated onto the solder layer 58 in a form that passes through the light source unit 23 so as to melt the solder layer 58, when adhering the light source unit 23 and the slider 22 using the solder layer 58 (see FIG. 2).

Furthermore, the unit substrate 230 has a size that is one size smaller than the slider substrate 220. However, a width $W_{UN}$ in the track width direction (in the Y axis direction) of the unit substrate 230 is larger than a width $W_{LA}$ in the track width direction (in Y axis direction) of the laser diode 40, and even if the laser diode 40 is installed on the light source electrode 410, the extraction electrode 411 is provided so as to be exposed on the light source installation surface 2302.

For example, if a femto slider is used for the slider substrate 220, the size of the unit substrate 230 can have a thickness $T_{UN}$ (in the X axis direction) of 320 μm, a width $W_{UN}$ in the track width direction of 350 μm, and a length $L_{UN}$ (in the Z axis direction) of 250 μm.

(Description of Slider)

Next, the configuration of the slider is described.

In the slider 22 illustrated in FIG. 1, the head element part 221 formed on the integrated surface 2202 is configured by including a magnetic head element 32 configured by including a magnetoresistive (MR) element 33 for reading data from a magnetic disk 10 (see FIG. 4) and an electromagnetic transducer element 34 for writing data to the magnetic disk 10, a spot size converter element 43 that receives laser light irradiated from the emission center 4000 of the laser diode 40, that converts the spot size of the laser light (converts to make smaller) and that guides the laser light to a waveguide 35, the waveguide 35 that guides the spot size converted laser light to or near a head end surface 2210 which is the air bearing surface, a near-field light generator 36 that couples with the laser light that propagates through the waveguide 35 and generates near-field light for thermal assistance, and a passivation layer 38 formed on the integrated surface 2202 so as to cover the magnetic head element 32, the spot size converter element 43, the near-field light generator 36, and the waveguide 35.

With this configuration, the optical system 31 for near-field light generation in the head 21 (head element part 221) is configured by including the spot size converter element 43, the waveguide 35, and the near-field generator 36.

The region surrounding the spot size converter element 43 and the waveguide 35 is coated by the passivation layer 38. This functions as a core for light propagation. On the other hand, the area of the passivation layer 38 that covers the surrounding region functions as cladding.

The MR element 33, the electromagnetic transducer element 34, and one end of the near-field light generator 36 reach the head end surface 2210 which is the air bearing surface. Herein, the head end surface 2210 and the ABS 2200 form the air bearing surface of the entire thermally-assisted magnetic recording head 21.

During the actual writing and reading of data, the thermally-assisted magnetic recording head 21 is configured to aerodynamically fly over the surface of the rotating magnetic disk 10 with a predetermined flying height. At this time, one end of both the MR element 33 and the electromagnetic transducer element 34 are configured to oppose the surface of the magnetic recording layer of the magnetic disk 10 with an appropriate magnetic spacing. Furthermore, in this state, the MR element 33 operates to read data by sensing a data signal magnetic field from the magnetic recording layer, and the electromagnetic transducer element 34 operates to write data by applying a data signal magnetic field onto the magnetic recording layer.

Herein, when writing data, laser light that passes from the laser diode 40 of the light source unit 23 and through the spot size converter 43 and that propagates through the waveguide 35 is converted to near-field light 62 (see FIG. 3) by the near-field light generator 36. This near-field light 62 is irradiated onto a part of the magnetic recording layer that performs the writing, and operates to heat this part of the magnetic recording layer. An anisotropic magnetic field (coercive force) in this part is reduced by heating to a value that can perform the writing, and thermally-assisted magnetic recording can be performed by applying a writing magnetic field by the electromagnetic transducer element 34 in this reduced part.

Furthermore, as illustrated in FIG. 1, the spot size converter element 43 is an optical element that receives the laser light irradiated from the laser diode 40 on a light receiving end surface 430 with a width $W_{SC}$ in the track width direction (Y axis direction), that converts to laser light with a smaller spot diameter with as little loss as possible and that guides to a light receiving end surface 352 of the waveguide 35.

In the present embodiment, the spot size converter element 43 is configured with a lower propagation layer 431 with a width in the track width direction (Y axis direction) that gradually narrows from a width $W_{SC}$ along the travel direction (−X direction) of the laser light incident from the light receiving end surface 430 for example, and an upper propagation layer 432 laminated on the lower propagation layer 431, with a width in the track width direction (Y axis direction) that more rapidly becomes smaller from width $W_{SC}$ as compared to the lower propagation layer 431 along the same direction of travel (−X direction) of the laser light.

Furthermore, the laser light incident from the light receiving end surface 430 is configured such that the spot size is gradually converted smaller while propagating through this laminate structure and that the laser light reaches the light receiving end surface 352 of the waveguide 35.

The width $W_{SC}$ at the position of the light receiving end surface 430 of the spot size converter element 43 is, for example, approximately 1 to 10 μm. Furthermore, the thickness $T_{SC}$ (in the Z axis direction) at the position of the light receiving end surface 430 is, for example, approximately 1 to 10 μm. Furthermore, the spot size converter element 43 is configured from a material with a higher refractive index than the refractive index $n_{OC}$ of the component material of the passivation layer 38 that covers the surrounding region, and is formed from the same material as the dielectric material that configures the waveguide 35 described later. In this case, the spot size converter element 43 and the waveguide 35 may be separate units or integrally formed.

Figure 3:
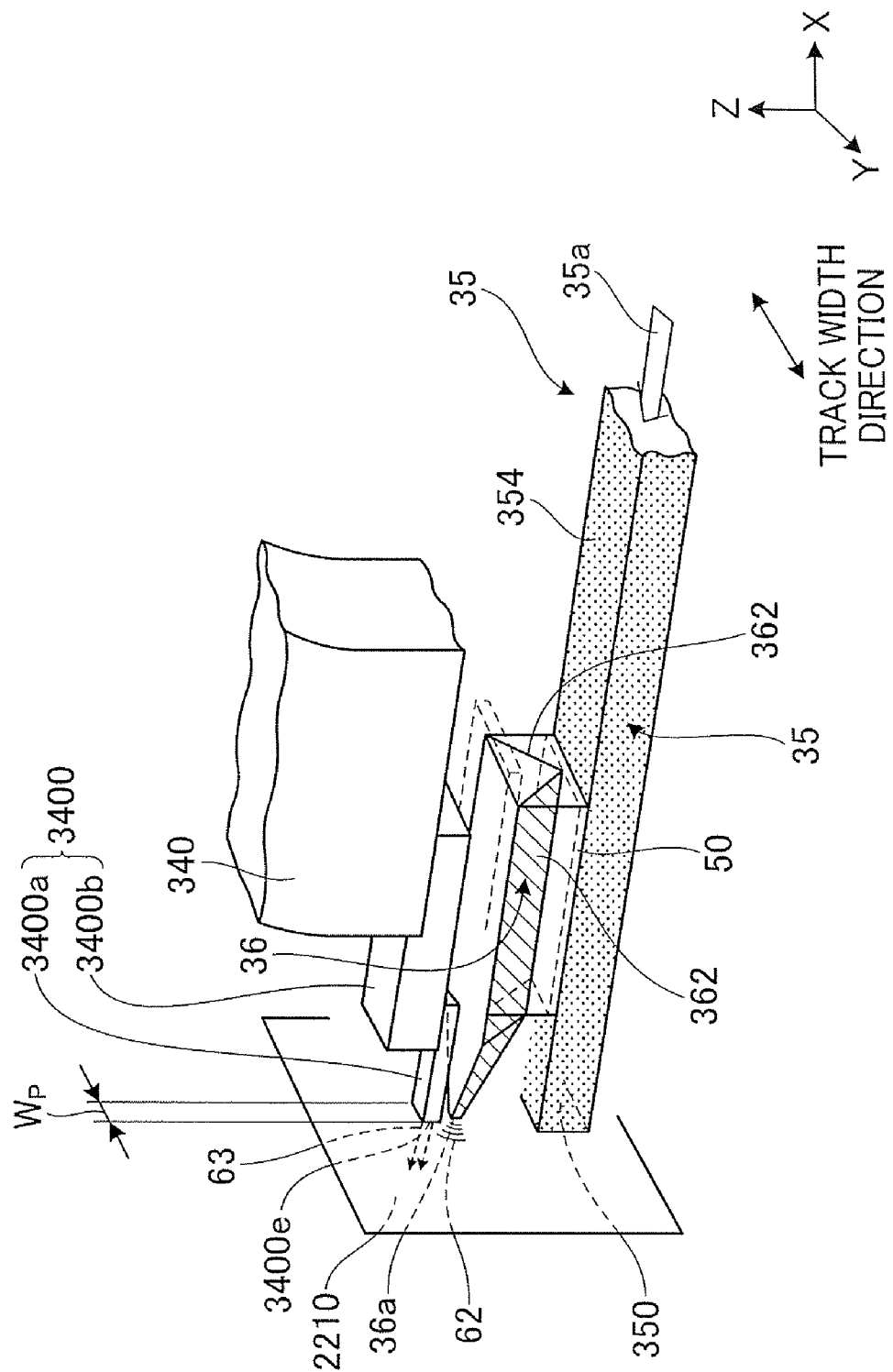
FIG. 3 is a perspective view schematically illustrating a configuration including a waveguide, a near-field light generator, and a main magnetic pole.

Furthermore, in the present embodiment, the waveguide 35 preferably extends parallel to the integrated surface 2202 from the light receiving end surface 352 that receives the laser light radiated from the spot size converter element 43 to the end surface 350 on the head end surface 2210 side. Herein, the end surface 350 may be a part of the head end surface 2210 or may be retracted by a predetermined distance from the head end surface 2210. Furthermore, as illustrated in FIG. 3, the part proximal to the end surface 350 that is one side surface of the waveguide 35 opposes the near-field light generator 36. Furthermore, the laser light (waveguide light) that is incident from the light receiving end surface 352 and that propagates through the waveguide 35, reaches the part opposing the near-field light generator 36 and can be coupled with the near-field light generator 36.

Furthermore, as illustrated in FIG. 1, a pair of terminal electrodes 370 and a pair of terminal electrodes 371 for the magnetic head element 32 are provided on an upper surface of the passivation layer 38 of the slider 22. Furthermore, the terminal electrodes 370 and 371 are also electrically connected to the connection pads of the wiring member 203 provided on the HGA 17 (see FIG. 5) by a method such as wire bonding, SBB or the like.

Furthermore, the slider substrate 220 may be a so-called femto slider, for example, with a thickness $T_{SL}$ (in the X axis direction) of 230 μm, a width $W_{SL}$ in the track width direction (in the Y axis direction) of 700 μm, and a length $L_{SL}$ (in the Z axis direction) of 850 μm.

The femto slider is generally used as a substrate for a thin-film magnetic head that can adapt to high recording density and includes a specification that is the smallest size for a slider that is currently being used. The slider substrate 220 may be formed from a ceramic material such as AlTiC ($Al_2O_3$—TiC), $SiO_2$ or the like.

(Description of Thermally-Assisted Magnetic Recording Head)

As described above, a preferable example of the thermally-assisted magnetic recording head 21 includes a configuration where the slider 22 and the light source unit 23 are connected and adhered with each other. Therefore, head 21 is manufactured by manufacturing individually and then combining the slider 22 and the light source unit 23.

As a result, for example, the physical properties and the reliability of the light source unit 23 are evaluated beforehand, and only the good parts are used for mounting to the head. Because of this operation, the manufacturing yield of the actual head 21 in the head manufacturing process is prevented from being seriously affected by the defect rate of the light source unit 23.

Herein, causes that have a significant effect on evaluation of the light source unit 23 include the light emission operating properties of the laser diode 40 and particularly the over time stability of the light emission operating properties. A reduction in the manufacturing yield of the actual head 21 can be avoided by checking these causes that have a significant effect on the manufacturing yield in an upstream of the manufacturing process and then by screening and selecting the light source units 23.

With the burn-in test of the present invention described later, the reliability evaluations that are critical for the screening and selecting of the light source units 23 that include a light source element (laser diode 40), particularly evaluations of the over time stability of the light emission operating properties of the laser diode 40, can be stably performed in large quantities at one time (economically). With the present invention in particular, a stable temperature is held in a short period of time, and a temperature that does not deviate with regards to the normal load conditions is maintained (temperature rise can be greatly suppressed). Therefore, the sorting test of good and defective light source unit chips is performed without damaging the elements.

(Description of Laser Diode 40 which is a Light Source)

Figure 2:
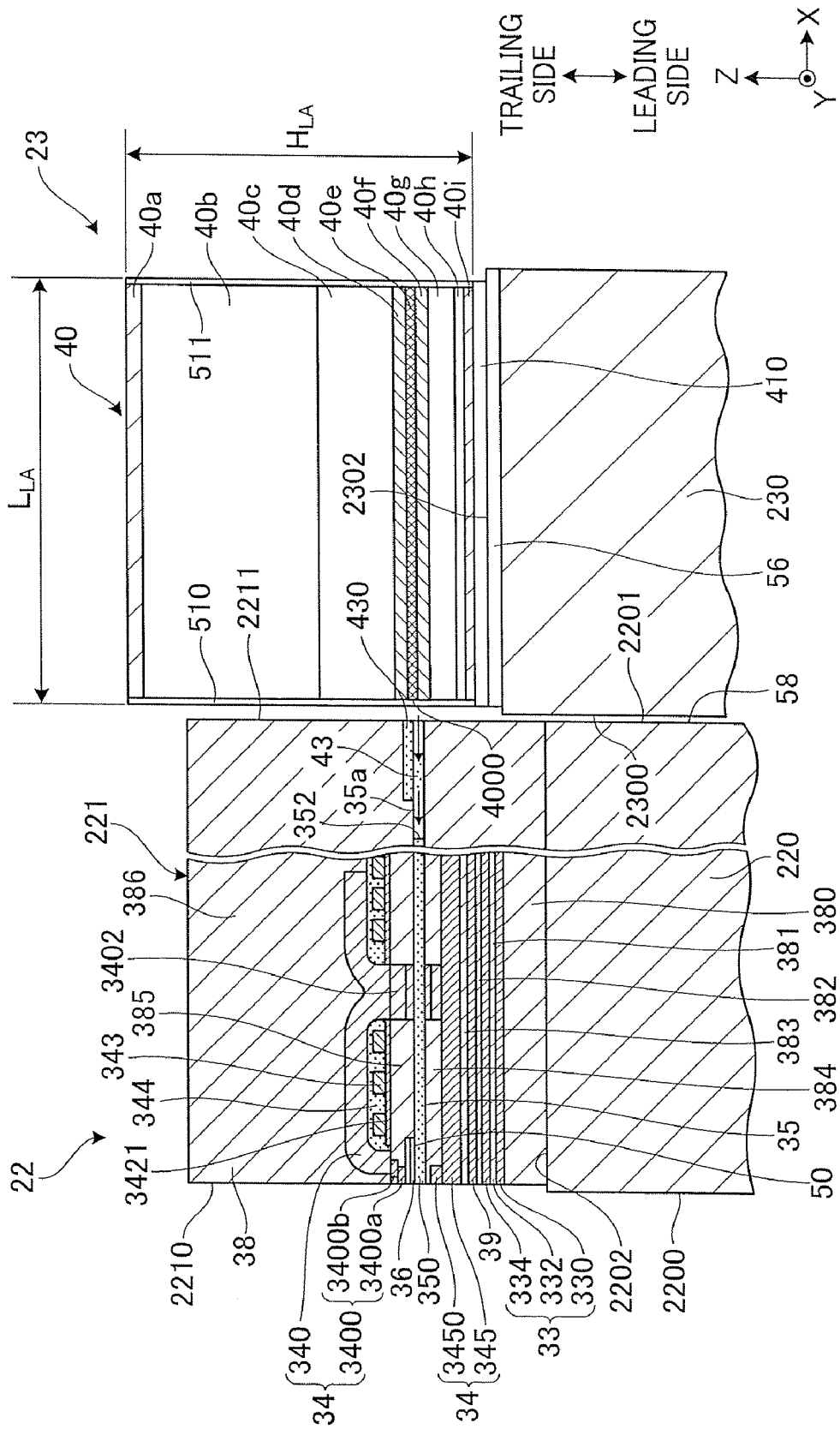
FIG. 2 is a cross-sectional view of plane A-A in FIG. 1 schematically illustrating a head element part of a slider, a laser diode in a light source unit, and a peripheral configuration thereof, for a thermally-assisted magnetic recording head.

FIG. 2 is a cross-sectional view of plane A-A in FIG. 1 schematically illustrating the head element part 221 of the slider 22, a laser diode 40 of a light source unit 23, and the peripheral configuration thereof, for a thermally-assisted magnetic recording head 21.

The laser diode 40 illustrated as a favorable example in FIG. 2 is an end surface emission type laser diode 40. Examples of the end surface emission type laser diodes 40 include InP types, GaAs types, GaN types and the like that are normally used for communication, optical disk storage, material analysis and the like.

Furthermore, the wavelength $\lambda_L$ of the laser light irradiated can be set to a value within a range of 375 nm to 1.7 μm, for example. The laser diode 40 illustrated in FIG. 2 has a multilayer structure containing in order from the upper surface side for example, an n-electrode 40, an n-GaAs substrate 40b, an n-InGaAlP cladding layer 40c, a first InGaAlP guide layer 40d, an active layer 40e composed of a multi-quantum well (InGaP/InGaAlP) and the like, a second InGaAlP guide layer 40f, a p-InGaAlP cladding layer 40g, a p-electrode under layer 40h, and a p-electrode 40i.

Furthermore, reflective layers 510 and 511 for exciting oscillation by total reflection are formed on the front and rear sides of a cleavage surface of the multilayer structure of the laser diode 40. Herein, the emission center 4000 exists at a position of the active layer 40e of the reflective layer 510. Furthermore, with the present embodiment, the n-electrode 40a is preferably made of Au or an Au alloy layer with a thickness of approximately 0.1 μm, for example, formed on the n-GaAs substrate 40b.

The configuration of the laser diode 40 is not restricted to the aforementioned configuration, and various forms are possible. However, in any case, when installing the laser diode 40, the light source electrode 410 is preferably adhered with the p-electrode 40i as the bottom surface. With an end surface emission type laser diode, the active layer 40e (emission center 4000) is normally positioned closer to the p-electrode 40i than to the n-electrode 40a in the lamination direction (Z axis direction). Therefore, the unit substrate 230 can more effectively function as a heat sink for the light source if the laser diode 40 is installed with the p-electrode 40i that is closer to the active layer 40e where the most heat is generated during operation, as the bottom surface. In actuality, appropriate handling of the heat generated from the laser diode 40 is extremely critical for maintaining proper operation of the laser diode 40 and the other elements in the head.

Furthermore, a power source in the magnetic disk device can be used when driving the laser diode 40. The magnetic disk device normally has a power source of approximately 2 to 5 V, for example, and has sufficient voltage for laser oscillation operation.

The width $W_{LA}$ of the laser diode 40 (see FIG. 1) is preferably approximately 150 to 250 μm for example. Furthermore, the length $L_{LA}$ of the laser diode 40 roughly corresponds to the resonator length which is the distance between the reflective layers 510 and 511, and for example, is preferably set to 300 μm or longer.

Furthermore, the height $H_{LA}$ of the laser diode 40 (see FIG. 2) is preferably set to a value within a range of 40 to 100 μm.

This height $H_{LA}$ corresponds to the vertical interval (in the Z axis direction) (distance in the Z direction) between the n-electrode 40a and the extraction electrode 411. In the burn-in test described later, if the electrodes have a vertical interval within this range, the surface roughness Ra of the electrodes that contact the sheet probe is preferably adjusted relatively. Adjusting the surface roughness Ra of the electrode is preferable because the contact condition between the sheet probe and the electrode is stabilized, and a more favorable burn-in test can be performed.

Furthermore, as illustrated in FIG. 2, the adhesion between the p-electrode 40i of the laser diode 40 and the light source electrode 410 on the unit substrate 230 is preferably performed by soldering using an AuSn alloy or the like that is one type of leadfree solder for example. Furthermore, the slider 22 and the light source unit 23 are adhered to each other in a form such that an adhesion surface 2300 of the unit substrate 230 and a back surface 2201 of the slider substrate 220 are opposing, with a solder layer 58 which is an adhesion layer interposed therebetween.

For example, if the unit substrate 230 is formed from a semiconductor material, such as Si, GaAs, SiC or the like, adhering the light source unit 23 and the slider 22 with a solder layer 58 composed of an AuSn alloy, for example, can be performed by irradiating Nd—YAG laser light through the unit substrate 230 on to the solder layer 58 and melting the solder layer 58.

(Description of Head Element Part)

As illustrated in FIG. 1 and FIG. 2, the head element part 221 includes the MR element 33, the electromagnetic transducer element 34, and the optical system 31.

As illustrated in FIG. 2, the MR element 33 is configured with an MR multilayer 332, a lower part shield layer 330 and an upper part shield layer 334. The lower part shield layer 330 and the upper part shield layer 334, as a pair, are arranged at positions to sandwich the MR multilayer 332 and an insulation layer 381 and are formed from a soft magnetic material. Furthermore, the MR element 33 is formed on an under layer 380 composed of an insulation material, such as $Al_2O_3$ (alumina), formed on the integrated surface 2202.

The MR multilayer 332 is a magnetically sensitive part that senses the signal magnetic field using the MR effect and may be configured by any of a current-in-plane giant magnetoresistive (CIP-GMR) multilayer, a current-perpendicular-to-plane giant magnetoresistive (CPP-GMR) multilayer, and a tunnel-magnetoresistive (TMR) multilayer.

In addition, the electromagnetic conversion element 34 is preferably for perpendicular magnetic recording and is configured by including an upper part yoke layer 340, a main magnetic pole 3400, a writing coil layer 343, a coil insulation layer 344, a lower part yoke layer 345 and a lower part shield 3450.

The upper yoke layer 340 is formed to cover the coil insulation layer 344. The main magnetic pole 3400 is formed in an insulation layer 385 made of an insulation material, such as $Al_2O_3$ (alumina). These upper part yoke layer 340 and main magnetic pole 3400 are magnetically connected to each other and configures a waveguide for guiding, while accommodating, a magnetic flux generated by applying a writing current to the writing coil layer 343, to the magnetic recording layer (perpendicular magnetization layer) of the magnetic disk 10 (FIG. 4) in which the writing is performed.

The main magnetic pole 3400 has a first main magnetic pole part 3400a that extends to the head end surface 2210 and has a small width W, in the track width direction (see FIG. 3), and a second main magnetic pole part 3400b positioned above the first main magnetic pole part 3400a and on the rear side (+X side) of the first main magnetic pole part 3400a. Herein, the aforementioned width W, is the length of a side in the track width direction (Y axis direction) on the end surface 3400e (see FIG. 3) on the head end surface 2210 of the main magnetic pole 3400, and designates a width of the distribution of the writing magnetic field in the track width direction (Y axis direction), and is approximately 0.05 to 0.5 µm, for example. The main magnetic pole 3400 is preferably formed from a soft magnetic material with a saturation magnetic flux density higher than an upper yoke layer 340, and for example, is preferably formed from a soft magnetic material of an iron-based alloy containing Fe as the primary component.

As shown in FIG. 2, the writing coil layer 343 is formed on an insulation layer 3421 made of an insulation material, such as $Al_2O_3$ (alumina), that is formed on the insulation layer 385, such that the writing coil layer 343 is formed to pass at least between the lower part yoke layer 345 and the upper part yoke layer 340 in a single turn. The writing coil layer 343 has a spiral structure that winds about a back contact part 3402.

Such writing coil layer 343 is preferably formed by a conductive material, such as Cu (copper) and the like. The writing coil layer 343 is covered by an insulation material, such as a thermally cured photoresist, and the like, for example, so that the writing coil layer 343 and the upper part yoke layer 340 are electrically insulated from each other. The writing coil layer 343 has a single layer in the present embodiment. However, there may be two or more layers, and it may be a helical coil. Moreover, the number of turns for the writing coil layer 22b shown in FIG. 2 is not particularly limited and may be set to 2 to 7 turns, for example.

A through hole extending in the X axis direction is provided at the back contact part 3402. The waveguide 35 and an insulation layer that covers the waveguide 35 pass through the through hole. In this through hole, an inner wall of the back contact part 3402 and the waveguide 35 are separated by a predetermined distance, such as at least 1 µm. As a result, the waveguide light is prevented from being absorbed by the back contact part 3402.

The lower part yoke layer 345 shown in FIG. 2 is formed on an insulation layer 383 formed of an insulation material, such as $Al_2O_3$ (alumina) and functions as a waveguide that guides a magnetic flux that returns from a soft magnetic under layer provided under the magnetic recording layer (perpendicular magnetization layer) of the magnetic disk 10. The lower part yoke layer 345 is formed by a soft magnetic material. The lower part shield 3450 is magnetically connected to the lower yoke layer 22d and is configured as a part of the waveguide that extends to the head end surface 2210. The lower part shield 3450 opposes the main magnetic pole 3400 across the near-field light generator 36. The lower part shield 3450 functions to take in the magnetic flux that is generated and diverged from the main magnetic pole 3400. The lower part shield 3450 has a high saturation magnetic flux density. The lower shield 22e is preferably formed by NiFe (Permalloy) or a ferroalloy material and the like that is similar to the main magnetic pole 3400.

As illustrated in FIG. 1 and FIG. 2, the optical system 31 includes the spot size converter element 43, waveguide 35, and near-field light generator 36.

The laser light 35a that has been converted to a smaller spot size by the spot size converter element 43 is incident to the light receiving end surface 352 of the waveguide 35 and propagated through the waveguide 35. The waveguide 35 extends from the light receiving end surface 352, through through-holes in the X axis direction provided in a back contact part 3402, to the end surface 350 on the head end surface 2210 side. The near-field light generator 36 is a near-field light generator that converts laser light (waveguide light) that has propagated through the waveguide 35 to near-field light.

The near-field light generator 36 and the part of the waveguide 35 on the head end surface 2210 side are provided between the lower part shield 3450 (lower part yoke layer 345) and the main magnetic pole 3400 (upper part yoke layer 340). Furthermore, a part of the upper surface (side surface) on the head end surface 2210 side of the waveguide 35 and a part of the lower surface of the near-field light generator 36 are opposing with a predetermined interval therebetween, and the region interposed between these parts forms a buffer part 50 with a refractive index that is lower than the refractive index of the waveguide 35 (see FIG. 3 in particular).

The buffer part 50 achieves a function of coupling the laser light (waveguide light) that propagates through the waveguide 35 to the near-field light generator 36. A detailed description of the aforementioned waveguide 35, buffer part 50 and near-field light generator 36 is provided below using FIG. 3.

Furthermore, as illustrated in FIG. 2, it is a preferred aspect that an interelement shield layer 39 interposed between the insulation layers 382 and 383 between the MR element 33 and the electromagnetic transducer element 34 (lower part yoke layer 345).

The interelement shield layer 39 can be formed from a soft magnetic material, and achieves a function of shielding the MR element 33 from magnetic fields generated by the electromagnetic transducer element 34. The aforementioned insulation layers 381, 382, 383, 384, 385 and 386 configure the passivation layer 38.

FIG. 3 is a perspective view schematically illustrating a configuration of the waveguide 35, the near-field light generator 36 and the main magnetic pole 3400. In FIG. 3, the head end surface 2210, which includes a position from which the writing magnetic field and the near-field light are irradiated towards the magnetic recording medium, is positioned on the left side of the drawing.

As illustrated in FIG. 3, the waveguide 35 for propagating the laser light (waveguide light) 35a for generating near-field light toward the end surface 350, and the near-field light generator 36 that receives the laser light (waveguide light) 35a and generates the near-field light 62 are provided. Furthermore, a part interposed between a part of the side surface 354 of the waveguide 35 and a part of the lower surface 362 of the near-field light generator 36 forms the buffer part 50. The buffer part 50 is formed from an insulation material, for example, and achieves a function of coupling the waveguide light 35a to the near-field light generator 36. For the light source and optical system illustrated in FIG. 1 through FIG. 3, the laser light irradiated from the emissions center 4000 of the laser diode 40 preferably has TM mode polarized light where the direction of oscillation of the electric field is in the Z axis direction.

As illustrated in FIG. 3, in the present embodiment, the near-field light generator 36 is formed from a metal material, such as Au, Ag, and an alloy containing Au or Ag, for example, and includes a triangular cross-section in the Y-Z plane. Furthermore, the end surface 36a that extends to the head end surface 2210 in particular has a shape of an isosceles triangle with a vertex opposite to the lower side on a reading side (−Z side). The near-field light generator 36 receives the laser light (waveguide light) 35a from the waveguide 35 through the buffer part 50 and generates near-field light 62 from the side surface 36a. The near-field light 62 is irradiated towards the magnetic recording layer of the magnetic disk 10 (see FIG. 4), reaches the surface of the magnetic disk 10, and heats up the magnetic recording layer part of the magnetic disk 10. As a result, the anisotropic magnetic field (coercive force) of that part decreases to a value at which writing can be performed. Immediately afterwards, a writing magnetic field 63 generated from the main magnetic pole 3400 is applied to that part to perform the writing, and thus so-called thermally-assisted magnetic recording can be performed.

The optical system for generating the light for thermal assistance provided in the head element part 221 is not restricted to the aforementioned configuration. For example, it is possible to use an optical system that uses a near-field light generator with a different shape or structure, or an optical system where a plasmon antenna composed of a metal piece is placed at the end of the waveguide.

(Description of Magnetic Disk Device)

Figure 4:
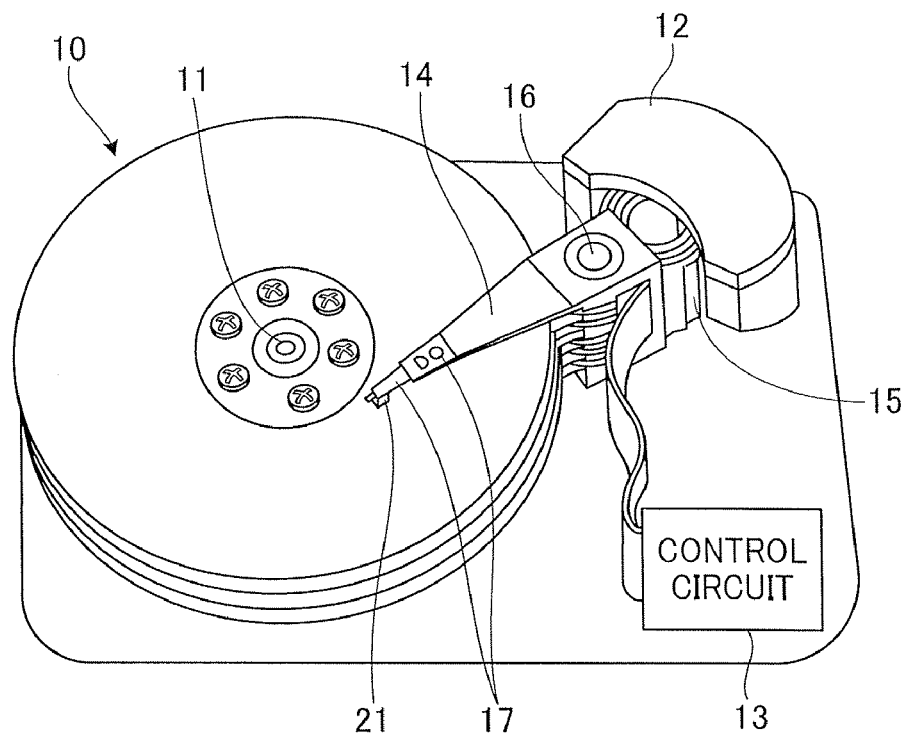
FIG. 4 is a perspective view schematically illustrating a configuration of main parts of an embodiment of a magnetic disk device according to the present invention.
Figure 5:
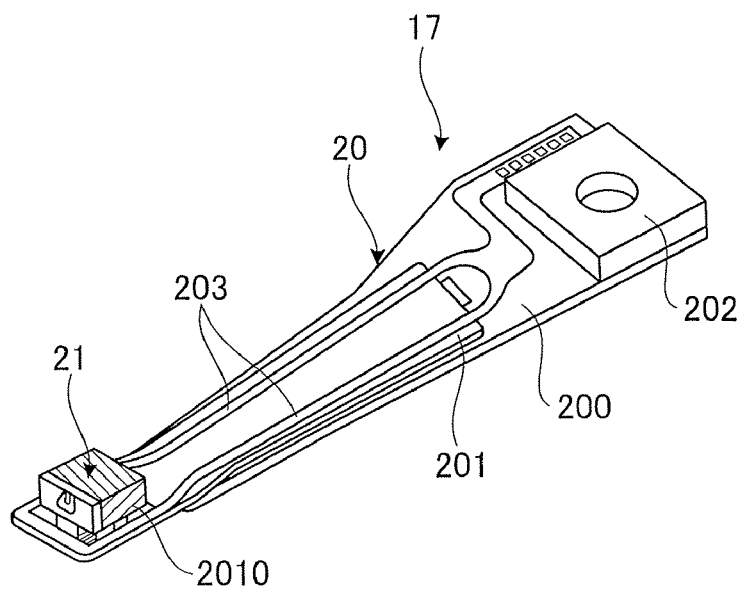
FIG. 5 is a perspective view schematically illustrating a configuration of main parts of an embodiment of a head gimbal assembly (HGA) according to the present invention.

FIG. 4 is a perspective view schematically illustrating major components of a preferable embodiment of a magnetic disk device. Furthermore, FIG. 5 is a perspective view schematically illustrating a configuration of major components of a preferred embodiment of a head gimbal assembly (HGA). In FIG. 5, the side of the HGA that opposes the surface of the magnetic disk is illustrated facing upward.

A magnetic disk device, which is a magnetic recording device shown in FIG. 4 includes a spindle motor 11, a plurality of magnetic disks 10 that rotate about a rotational axis of the spindle motor 11, an assembly carriage device 12 provided with a plurality of drive arms 14, a head gimbal assembly (HGA) 17 attached to a front end of each drive arm 14 and having a thermally-assisted magnetic recording head 21, and a recording/reproducing/emission control circuit 13 that controls a light emission operation of the laser diode 40, which is a light source that generates laser light for the later-discussed thermally-assisted magnetic recording.

In the present embodiment, the magnetic disks 10 are preferably for perpendicular magnetic recording and includes a configuration, in which a soft magnetic under layer, an intermediate layer and a magnetic recording layer (perpendicularly magnetized layer), for example, are sequentially laminated on a disk substrate.

The assembly carriage device 12 is a device for positioning the thermally assisted magnetic recording head 21 on a track of the magnetic disk 10. In the assembly carriage device 12, the drive arms 14 are stacked in a direction along a pivot bearing shaft 16 and are angularly swingable by a voice coil motor (VCM) about the shaft 16. The configuration of the magnetic disk device of the present invention is not limited to the above-described configuration but may include only a single set of the magnetic disk 10, the drive arm 14, the HGA 17 and the head 21.

In the head gimbal assembly (HGA) 17 shown in FIG. 5, a suspension 20 includes a load beam 200, a flexure 201 that is fixed to the load beam 200 and has elasticity, a base plate 202 provided at a base of the load beam 200, and a wiring member 203 provided on the flexure 201 and formed from a lead conductor and connection pads electrically connected to both sides of the lead conductor.

The thermally-assisted magnetic recording head 21 opposes a surface of the respective magnetic disk 301 with a predetermined space (flying height) and is fixed to the flexure 201 at the front end of the suspension 20.

An opening 2010, for example, is provided on the flexure 201. The thermally-assisted magnetic recording head 21 is adhered so that the light source unit 23 is exposed from the other side of the flexure 201 through the opening 2010, for example.

Further, the connection pads that forms an end of the wiring member 203 is electrically connected to terminal electrodes 370 and 371 (see FIG. 1) for a magnetic head element 32 of the thermally assisted magnetic recording head 21 by a method such as wire bonding, SBB and the like. Moreover, the connection pads are electrically connected to an extraction electrode 411 and an n-electrode 40a of the laser diode 40 (see FIG. 1) by a method, such as wire bonding, SBB and the like. As a result, it is possible to electrify and drive the MR element 33, the electromagnetic conversion element and the laser diode 40. The structure of the suspension 20 is also not limited to the above-described structure but may include a head driving IC chip (not shown) attached to the middle of the suspension 320.

(Description of Manufacturing Example for Inspection Subject that was Prepared when Performing Burn-in Test)

Figure 6A:
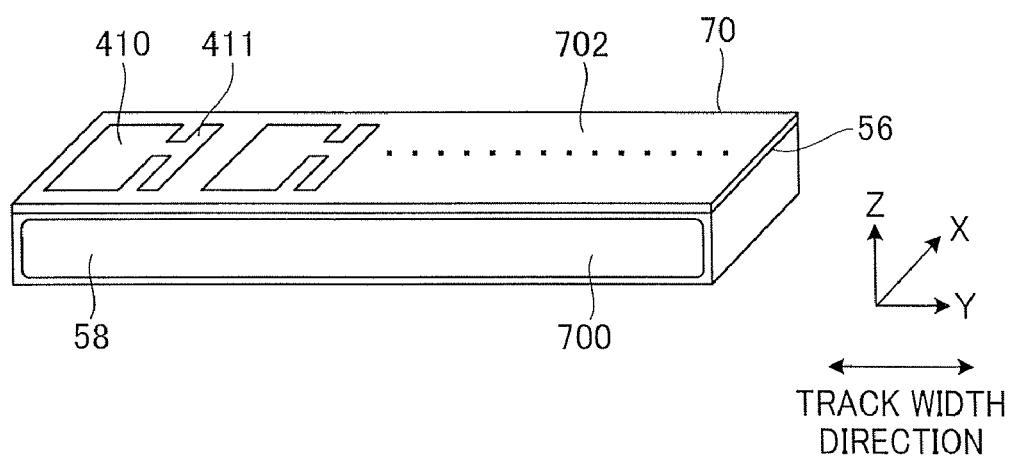
FIG. 6A through FIG. 6C are perspective views schematically illustrating an embodiment of a method for manufacturing inspection samples to be screened when a burn-in test is collectively performed on a plurality of light source units that are used by joining to a thermally-assisted magnetic recording head.
Figure 6B:
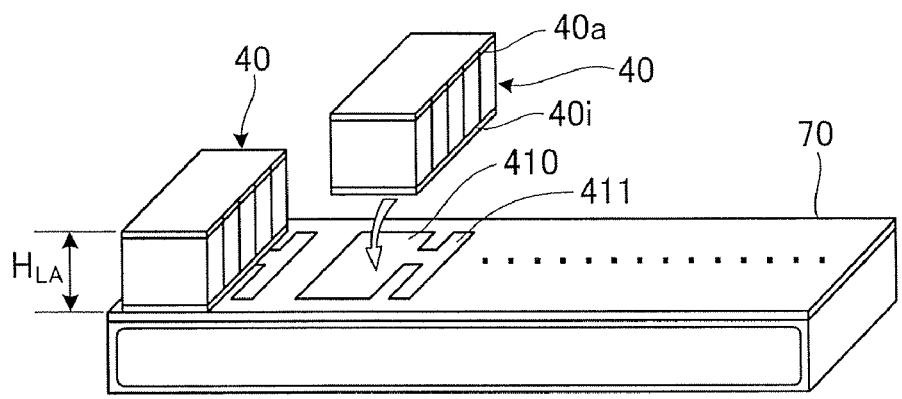
Figure 6C:
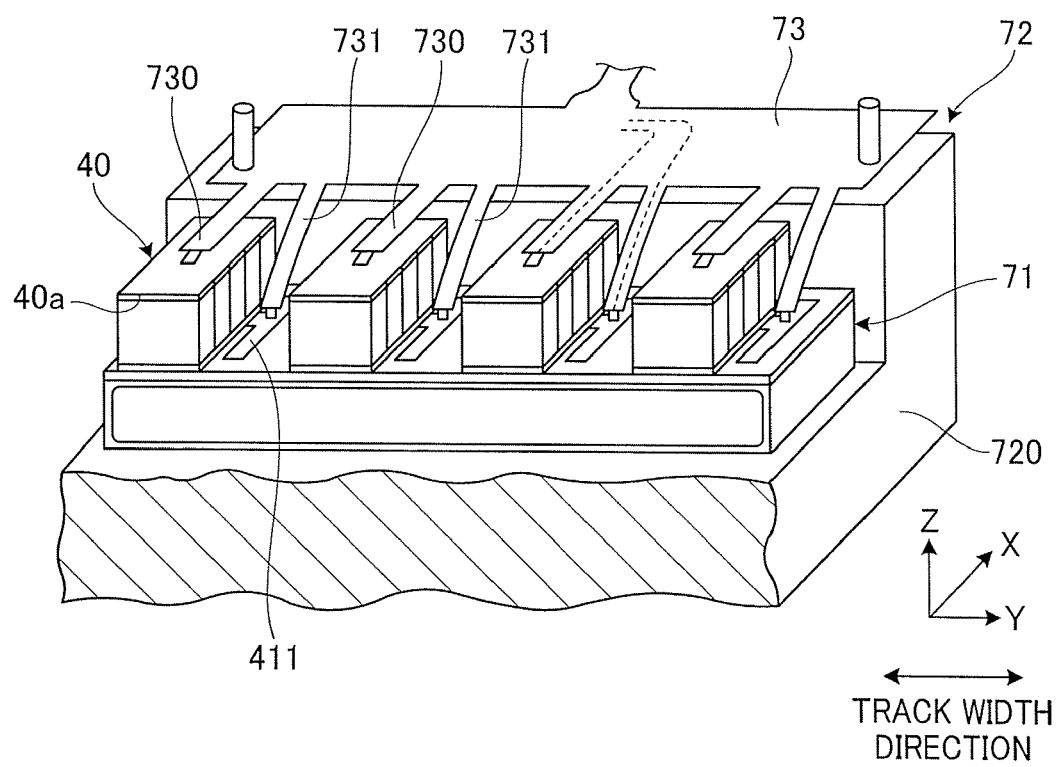

FIGS. 6A through 6C are perspective views schematically illustrating an embodiment of a manufacturing method for an inspection subject that is to be screened, when performing a burn-in test collectively on a plurality of light source units 23 that are used by joining to the aforementioned thermally-assisted magnetic recording head 21.

Figures 9A, 9B:
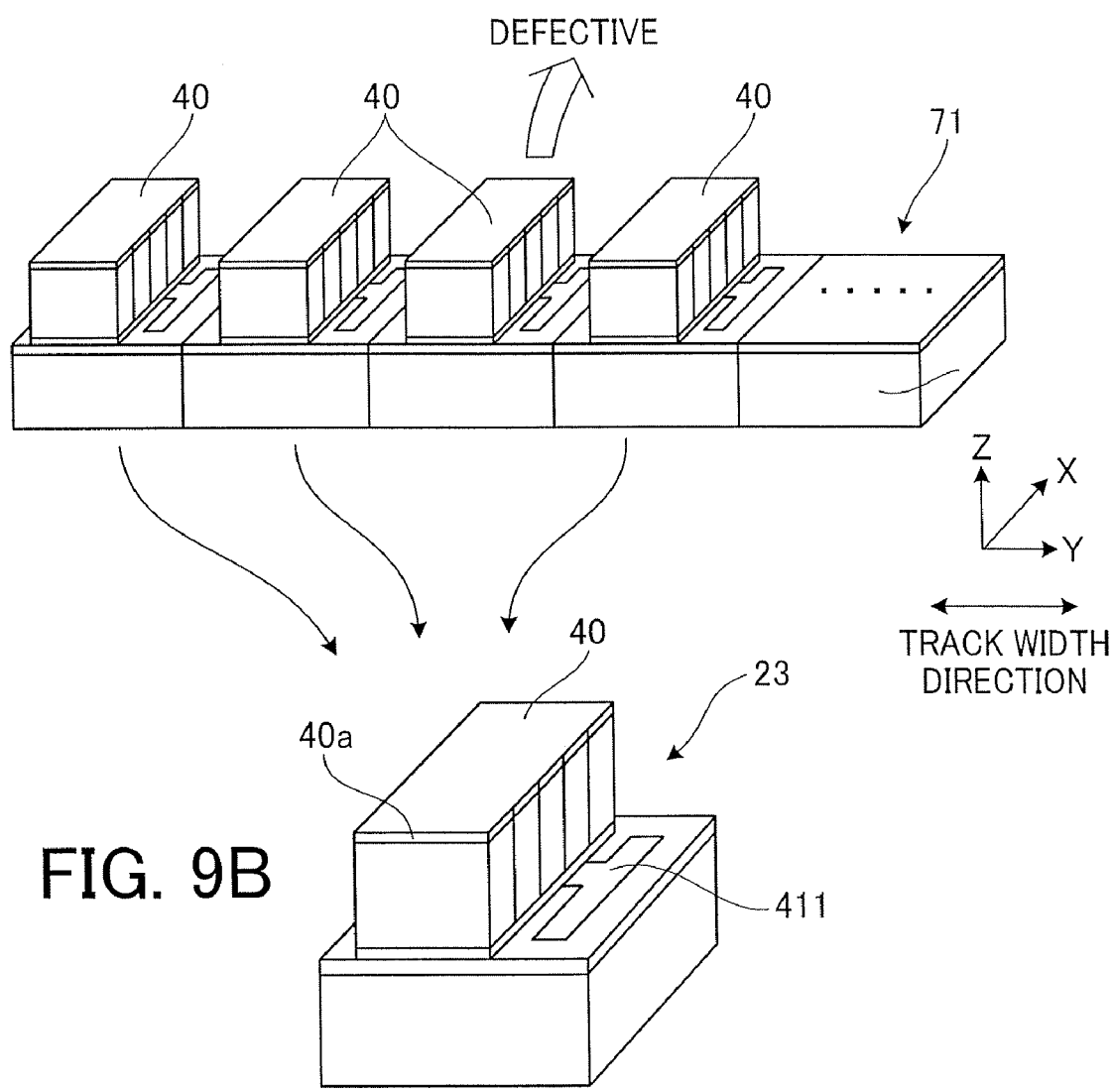
FIG. 9A and FIG. 9B are perspective views for describing handling of a light source unit after the burn-in test.

Furthermore, FIGS. 9A and 9B are a cross-sectional view and a bottom view illustrating a structure of a sheet probe that is a favorable example used in the burn-in test. FIG. 11 is a schematic view for describing a condition of contact between each electrode and the sheet probe of an embodiment that is favorably used in the burn-in test. However, the structure of the probe is not restricted to the illustrated example, and various other forms are possible. In other words, the probe structure is not particularly restricted, so long as the configuration can conduct electricity to the laser diode 40 of the light source unit 23.

According to a preferred embodiment illustrated in FIG. 6A, a plurality of sets of light source electrodes 410 and extraction electrodes 411 are first formed on a light source installation surface 702 of the light source element arrangement bar 70, using, for example, either a sputtering method, a plating method or a vapor method, and either a deposition method, a photolithography, a milling method or the like. At this time, providing an insulation layer 56 on the light source installation surface 702, and forming these electrodes on the insulation layer 56 are also the preferable form.

The light source element arrangement bar 70, on which the plurality of sets of light source electrodes 410 and extraction electrodes 411 are formed, may be obtained by arranging and forming a plurality of sets of light source electrodes 410 and extraction electrodes 411 on a disk shaped wafer for example, and then cutting apart the wafer into a plurality of bar shapes. The light source element arrangement bar 70 is a member that becomes individual unit substrates 230 by cutting and separating.

As a more preferable form, the extraction electrode 411 that is provided contacts the sheet probe in a subsequent burn-in test process. The surface of the extraction electrode 411 preferably has a surface roughness Ra that is set to be 0.005 µm or higher and 0.5 µm or lower, for example. By selecting the film forming method when forming the extraction electrode 411, and by adjusting the film forming conditions of the film forming method, the surface roughness Ra can be made controllable. Moreover, the surface roughness Ra can be adjusted to approximately 0.1 for example, by precisely polishing the metal surface of the extraction electrode 411.

Herein, the surface roughness Ra is the arithmetic mean roughness Ra specified in Japan Industrial Standard (JIS) B 0601:2001. This arithmetic mean roughness Ra is the value obtained by plotting a roughness curve (f(x)) over a center line (x-axis), and dividing the area obtain between the plotted roughness curve and the centerline by the length (L) of the measured region, expressed in units of micrometers. In other words, $Ra=L^{-1}\int_0^L |f(x)|dx$.

Next, as similarly illustrated in FIG. 6A, the solder layer 58 composed, for example, of AuSn alloy is formed on an adhesion surface 700 for connecting with the slider 22 of the light source element arrangement bar 70, by a sputtering method, vapor deposition method or the like, for example.

By using the solder layer 58 made of this type of metal material, the solder layer 58 can later be melted using laser light, such as Nd—YAG laser light, and thereby, the light source unit 23 and the slider 22 can be adhered.

Next, as illustrated in FIG. 6B, each of a plurality of laser diodes 40 is placed on each light source electrode 410 with the p-electrode 40i of the laser diode 40 on the bottom, and then adhered to the light source electrode 410.

Thereby, a light source unit bar 71 can be obtained with the plurality of light sources on the light source element arrangement bar 70. With this light source unit bar 71, each of the chips will become light source units 23 by being cut apart. The adhesion of the laser diodes 40 to the light source element arrangement bar 70 can be performed by forming a vapor deposition film of AuSn alloy or the like on the light source electrode 410 in advance, placing the laser diode 40 on this vapor deposition film (light source electrode 410), and heating to a temperature of approximately 200 to 300° C. using a hot plate or the like under a hot air blower.

Herein, the n-electrode 40a that forms the upper surface of the laser diode 40 to be mounted is preferably configured so as to contact with the sheet probe during the subsequent burn-in test process. Therefore, as described below in detail, the surface of the n-electrode 40a preferably has a surface roughness Ra that is set to be 0.5 µm or higher and 10 µm or lower. Furthermore, the surface roughness Ra of the n-electrode 40a as the upper electrode is preferably set to be larger than the surface roughness Ra of the extraction electrode 411 as the aforementioned lower electrode.

The surface roughness Ra of the n-electrode 40a that becomes the upper surface of the laser diode 40 can be adjusted as described below for example. In other words, with the laser diode 40, the surface of the n-GaAs substrate 40b on the side where the n-electrode 40a is formed (see FIG. 2) is normally subjected to a predetermined polishing process. However, the surface roughness Ra of the n-electrode 40a can be adjusted by a method of setting the coarseness of the grindstone that is used during the polishing process to be greater, providing a predetermined roughness that is greater than normal on the surface of the n-GaAs substrate 40b, and then forming the n-electrode 40a. Generally, the n-electrode 40a of the laser diode 40 is frequently made to have high smoothness to enable stable wire bonding that is required when mounting to a can package which is a can-shaped package for protection. There are cases where the surface roughness Ra is less than 0.5 µm, for example. Even in this case, the value for the surface roughness Ra of the n-electrode 40a can be set larger by first performing the aforementioned process.

Furthermore, the height $H_{LA}$ (see FIG. 2) of the laser diode 40 to be mounted is preferably set to be 40 µm or more and 100 µm or less. The range of the height $H_{LA}$ normally includes the height of an end surface emission type laser diode chip for general use.

Next, as illustrated in FIG. 6C, a light source unit bar 71 that is configured and adjusted as described above is set in a fixture stand 720 of a burn-in test device 72. The burn-in test device 72 preferably uses a sheet probe set 73 in which strip-shaped sheet probes 730 for the n-electrodes 40a and strip-shaped sheet probes 731 for the extraction electrodes 411 are alternatingly arranged, as the specification for a probe that electrifies the laser diode 40. However, the probe specification is not restricted to this.

As illustrated in FIG. 6C, the sheet probe 730 is made to contact with the n-electrode 40a of the light source unit bar 71 that was set, and the sheet probe 731 is made to contact with the extraction electrodes 411. Next, the laser diodes 40 are electrified either through the sheet probe 730 and the n-electrode 40a or through the sheet probe 731 and the extraction electrode 411 to perform the burn-in test.

Figure 10A:
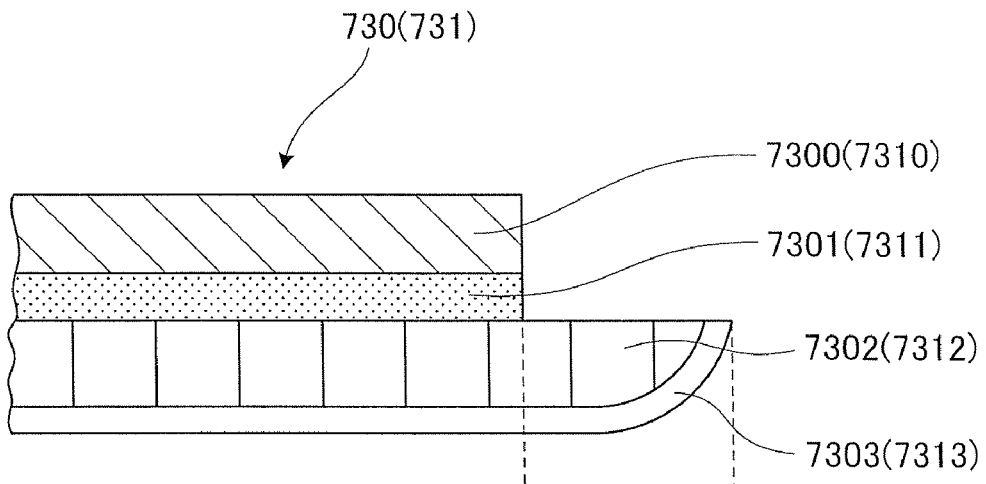
FIG. 10A and FIG. 10B are, respectively, a cross-sectional view and a bottom surface view illustrating the structure of a sheet probe that is used in the burn-in test.
Figure 10B:
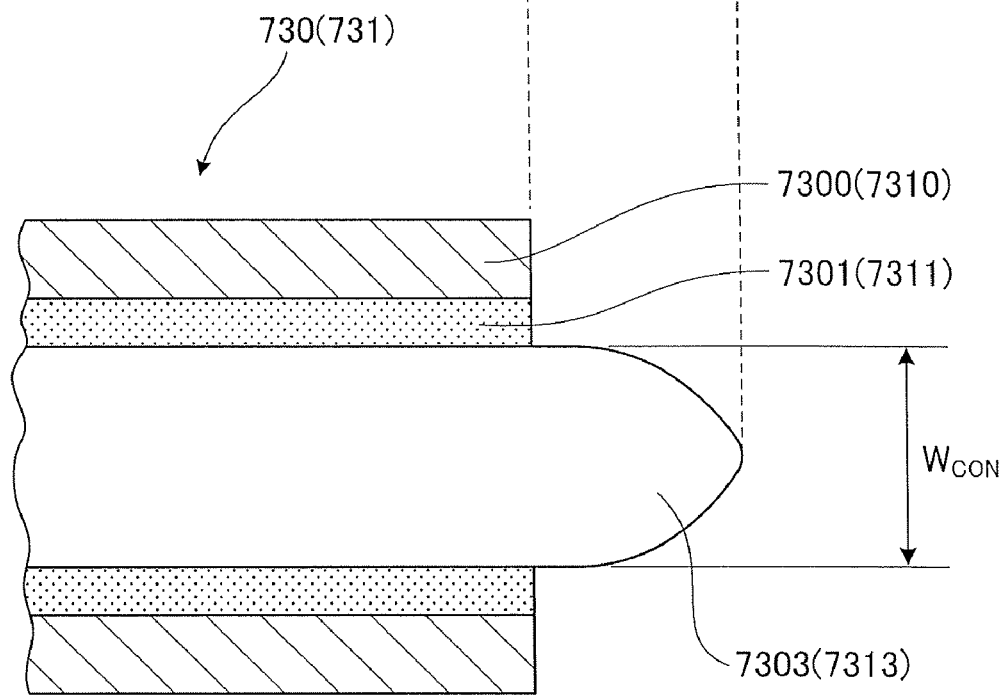

As illustrated in FIGS. 10A and 10B, the sheet probe 730 (731) includes, for example, a substrate 7300 (7310) with a thickness of approximately 20 μm, for example, composed of an elastic material such as stainless steel for example, an insulation layer 7301 (7311) with a thickness of approximately 10 μm, for example, composed of an insulation material such as polyimide, for example, formed on the substrate 7300 (7310), a conductive layer 7302 (7312) with a thickness of approximately 20 μm, for example, composed of copper or the like, for example, formed on the insulation layer 7301 (7311), and a conductive coating layer 7303 (7313) with a thickness of approximately 10 μm, for example, composed of Au or Au alloy or the like formed so as to cover the conductive layer 7302 (7312) by a plating method, for example.

The conductive layer 7302 (7312) extends from the substrate 7300 (7310) on the side that contacts with the n-electrode 40a (extraction electrode 411). The width $W_{CON}$ of the extended part of the conductive layer 7302 (7312) may be approximately 30 μm, for example. Furthermore, the conductive coating layer 7303 (7313) covers at least the part of the conductive layer 7302 that contacts the n-electrode 40a (extraction electrode 411). The sheet probes 730 and 731 are not restricted to the aforementioned shapes, and, for example, other structures where a conductive layer that can bend suitably contacts the electrode may also be acceptable.

FIG. 11 illustrates a condition where the sheet probes 730 and 731, which are a preferred embodiment, contact the n-electrode 40a or the extraction electrode 411, respectively. In FIG. 11, the sheet probe 730 contacts the n-electrode 40a. The n-electrode 40a is at a position (level) higher than the extraction electrode 411 by the height $H_{LA}$. Herein, in the present embodiment, the "height" position of the electrode is a measure of position of the electrode in the Z axis direction, and a "higher" position indicates that the electrode is more to the +Z side.

Therefore, the conductive layer 7302 (conductive coating layer 7303) on the tip end part of the sheet probe 730 contacts the n-electrode 40a at a smaller angle than the conductive layer 7312 (conductive coating layer 7313) at the tip end part of the sheet probe 731. Herein, the condition of contact between the sheet probe and the electrode was found by testing and experience to generally be largely dependent on the angle that the edge of the sheet probe contacts the electrode. In actuality, the angle of contact between the conductive layer 7302 (conductive coating layer 7303) and the n-electrode 40a is shallower. Therefore the pressure that the conductive layer 7302 (conductive coating layer 7303) and the n-electrode 40a presses each other is dispersed by the amount of area of the contact region between the conductive layer 7302 (conductive coating layer 7303) and the n-electrode 40a, and thus the point of contact is difficult to determine. As a result, based on such angle, problems can easily occur where the state of contact between both members is not stable.

Therefore, for the embodiment illustrated in the figures, in a preferred form, a surface roughness Rat of the n-electrode 40a is set to be greater than a surface roughness Ra2 of the aforementioned extraction electrode 411. The vertical interval $H_{LA}$ between both electrodes (see FIG. 2) is in a range of 40 to 100 μm. if the surface roughness Ra2 is a value in a range of 0.005 to 0.5 μm, the surface roughness Rat is preferably set to value within a range of 0.5 to 10 μm. Thereby, the conductive layer 7302 (conductive coating layer 7303) of the sheet probe 730 and the n-electrode 40a, where the contact angle is shallow and the state of contact is difficult to stabilize, can more stably be brought into contact.

(Description of Burn-in Test Method that is a Major Part of the Present Invention)

Figure 7:
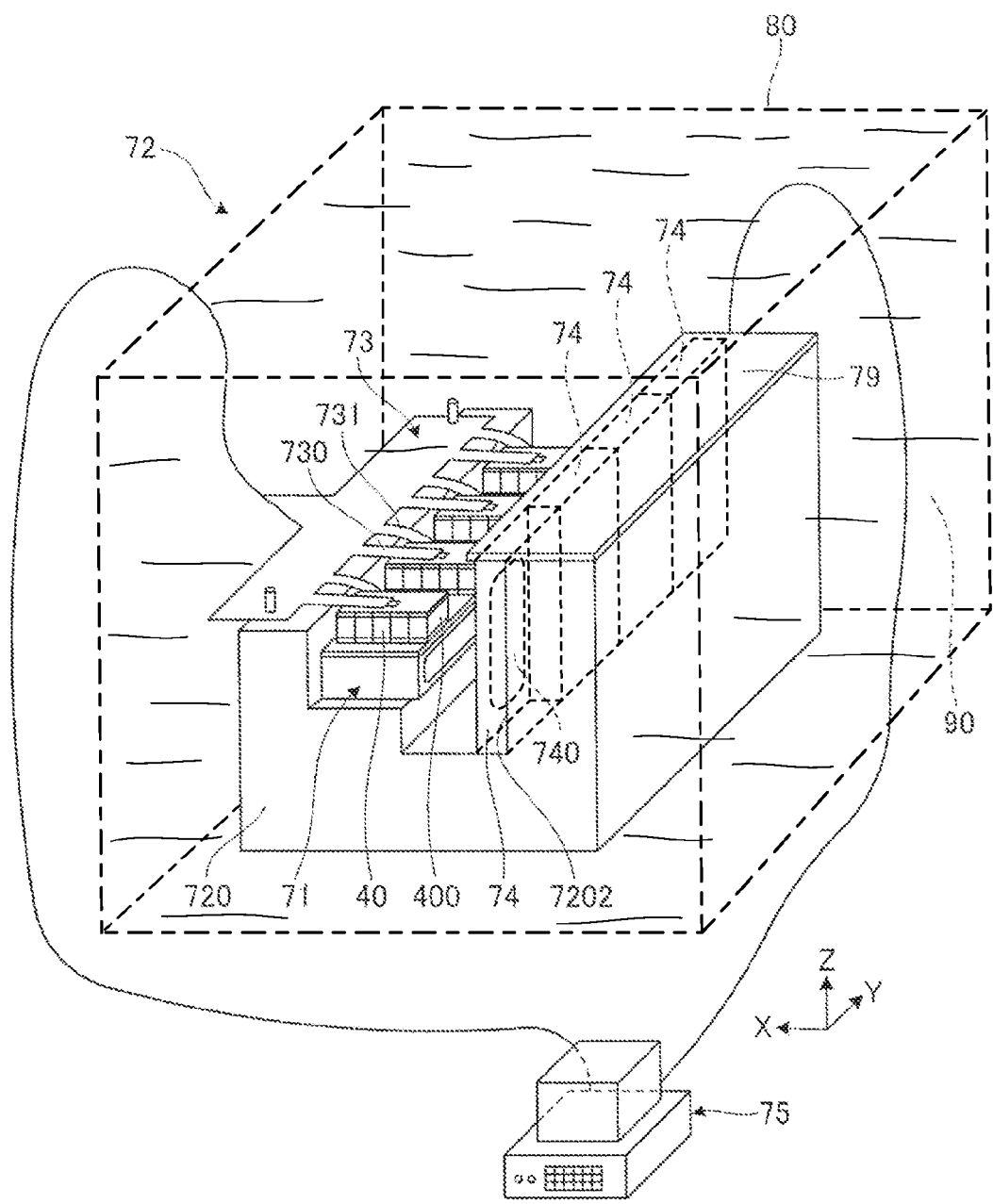
FIG. 7 is a perspective view of a burn-in test device and is a diagram for describing main parts of the method for performing a burn-in test of the present invention.

Next, the burn-in test is performed on the light source unit bar 71 that was set, using a burn-in test device 72 as illustrated in FIG. 7.

The burn-in test method of the present invention is performed by assembling on a fixture stand a plurality of light source elements composed of the laser diodes 40 or the like, for example, and a plurality of light detectors composed of photodiodes or the like, for example, for monitoring the light output from each of the plurality of light source elements, and electrifying the plurality of light source elements in a state where at least the plurality of light source elements and the plurality of light detectors are immersed in an insulation liquid.

In FIG. 7, the housing drawn by double dot lines is a container body 80 for storing the insulation liquid 90 and for immersing the fixture stand 720, to which the light source elements and light detectors are attached, in the insulation liquid 90.

The container body 80 may be an open container where the top part is open, or may be provided with a lid that can close the opening of the top part. The insulation liquid 90 can be poured in and the fixture stand 720 can be inserted through the opening provided in the container body 80. Furthermore, a plumbing system for injecting and removing the insulation liquid 90 may be provided via a valve.

The insulation liquid 90 that is used in the burn-in test method of the present invention is a liquid that has high specific resistivity, that is clear and colorless, that has favorable thermal conductivity, and that is excellent in safety at 80° C. or higher. In particular, a liquid with physical properties where the transmissivity is 99.9% or higher at a thickness of 1 mm for light with a wavelength between 600 and 1000 nm is preferably used. By including physical properties with this transmissivity, the light emitted from the light source element composed of a laser diode 40 or the like can positively be detected by a light detector composed of the photodiode 74 or the like.

The term "insulation" referred to in the present invention means that the volumetric resistivity (specific resistivity) at ambient temperature (25° C.) is $10^8$ [Ω·cm] or higher. In the present invention, a range of $10^{12}$ to $10^{14}$ [Ω·cm] is particularly preferable.

For example, naphthalene-based oils, isoparaffin-based oils, hydrofluoro-based oils and the like are preferably used as the insulation liquid. For example, an electric discharge machining liquid, lubricating oil, coolant and the like can also be used as this type of oil. Furthermore, a liquid with a refractive index of approximately 1.25 to 1.9 is preferably used. In particular, if an insulation liquid with a large refractive index is used, the light receiving surface of the photodiode 74 can be made smaller because the dispersion angle of the light emitted from the laser diode 40 will be narrower. Thereby, the arrangement pitch of the plurality of photodiodes 74 can be made smaller, and in conjunction, the arrangement pitch on the bar of the laser diodes 40 can be made smaller. The number of the laser diodes 40 that can be inspected at one time can be increased, and the work efficiency is greatly improved.

The insulation liquid 90 that is stored in the container body 80 is preferably stirred during the burn-in test. The stirring mechanism is not particularly restricted. However, stirring can be performed from above the liquid by attaching stirring blades such that the stirring blades are immersed in the upper part of the insulation liquid 90 and then slowly moving the stirring blades back and forth in the longitudinal direction for example. The temperature of the fixture stand drops because of the stirring. However, if the stirring is performed insufficiently, temperature variation occurs. Furthermore, it has been confirmed by testing that if stirring is performed at a sufficient stirring speed, the positional temperature variation is relieved, while at the same time, the temperature of the fixture stand is reduced.

Figure 8:
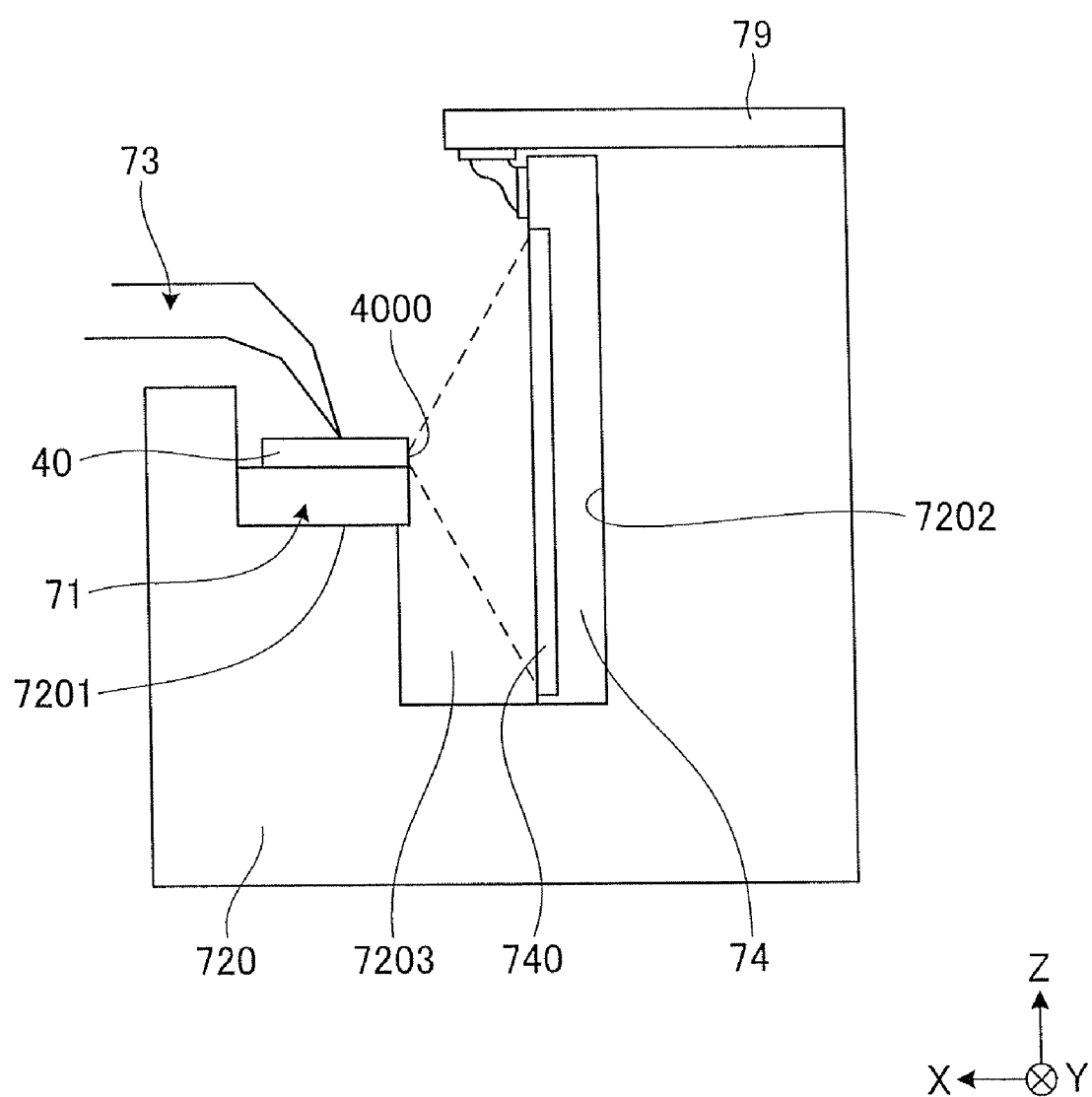
FIG. 8 is a front view of FIG. 7 and is a view from the X-Z plane.

In a preferable example illustrated in FIG. 7 and FIG. 8, the burn-in test device 72 includes the fixture stand 720, the sheet probe set 73, the plurality of photodiodes 74 fixed on the fixture stand 720, and a controller 75.

The photodiode 74 is a light detector that receives on a light receiving surface 740 laser light generated from the laser diode 40 supplied with electrical current through the sheet probe set 73, and measures the light output of each of the laser diodes 40. The photodiodes 74 are fixed so as to stand vertically along a wall part 7202 which is a perpendicular surface of the fixture stand 720, and a plurality of units are arranged in order in the Y direction which is the depth direction in the drawing. In the drawing, only 4 photodiodes 74 are drawn for the sake of space. However, in actuality, the number is in units of several hundreds for example. The same applies to the laser diodes 40.

A printed circuit board 79 including a control circuit is fixed to the upper part of the photodiodes 74, and the photodiodes 74 are connected to the controller 75 through this print board 79. The arrangement pitch of the photodiodes 74 in the Y direction is normally the same pitch as the arrangement pitch of the laser diodes 40 in the Y direction.

The fixture stand 720 is preferably formed from a material with high thermal conductivity, such as a Cu material or a Cu alloy material, for example. However, there is no restriction to these materials in particular.

As illustrated in FIG. 8, the fixture stand 720 includes a mounting part 7201 for mounting the light source unit bar 71 that is set, and the aforementioned wall part 7202 for fixing the plurality of photodiodes 74 in a standing condition opposite the light emitting surface 4000 of the laser diodes 40 of the light source unit bar 71.

A recessed part 7203 is formed between the mounting part 7201 and the wall part 7202, and the structure is such that the light output to be measured is not hindered. Normally, a temperature sensor is embedded near the lower part of the mounting part 7201. The mounting part 7201 for mounting the light source unit bar 71 is made such that the light source unit bar 71 on which the light source elements are arranged can be detachably fixed. Thereby, the light source unit bar 71 that is subject to inspection can easily be removed, and thus the operability can be improved.

The controller 75 is a device that receives the measurement output from the photodiodes 74 and controls and measures the current supplied to the laser diodes 40. As this device, a computer with control software may be used.

In the burn-in test, first the controller electrifies each laser diode mounted on the light source unit bar 71 through the sheet probe set 73, and determines the value $I_{OPO}$ of the supplied current $I_{OP}$ necessary to obtain a predetermined light output $P_{LAC}$ (e.g., several tens of mW) from each of the laser diodes 40. For example, the value $I_{OPO}$ is several tens of mA. Herein, the light output of each of the laser diodes 40 is determined based on the measurement output from the photodiode 74, of which the light receiving surface 740 is opposite the emission center 4000 of the subject laser diode 40.

Next, the controller 75 continuously supplies current $I_{OP}$ while always controlling the laser diode 40 so that the light output $P_{LA}$ from each of the laser diodes 40 is continuously at a prescribed value $P_{LAO}$. In this case, the value of the supply current $I_{OP}$ at the beginning of the test is $I_{OPO}$.

Next, the controller 75 measures the change in the value of the current $I_{OP}$ supplied to each of the laser diodes 40 for a fixed period of time while maintaining the light output from each of the laser diodes 40 at a fixed value $P_{LAO}$. The controller 75 judges the laser diode 40 to be defective when the value of the supply current $I_{OP}$ exceeds a predetermined upper limit value $I_{MAX}$ after a predetermined period of time has elapsed, and forms a list of the laser diodes 40 that are defective.

With the present invention, the burn-in test is performed by electrifying the plurality of light source elements while at least the light source elements composed of the laser diodes 40 and the like and the light detectors composed of a plurality of photodiodes or the like, for example, for monitoring the light output from each of the plurality of light source elements are immersed in the insulation liquid. Therefore, a stable temperature is held in a short period of time, and a temperature that does not deviate with regards to the normal load conditions can be maintained. As a result, a test of selecting good and defective light source unit chips can be performed without causing damage to the elements.

Furthermore, a plurality of laser diodes 40 can be evaluated in parallel in a state of the light source unit bar 71 prior to cutting and separating into individual light source unit chips. By performing this type of parallel processing, a burn-in test for a large number of the laser diodes 40 can be performed at one time, and the number of reliability evaluation processes and the time can be greatly reduced.

In this manner, as illustrated in FIGS. 9A and 9B, after the burn-in test of the light source unit bar 71, the light source unit bar 71 that has been removed from the device is cut and separated into a plurality of light source unit chips. Herein, the light source unit chips with defective laser diodes are removed from the separated chips, and as illustrated in FIG. 9B, the light source unit chips judged to be good are obtained and used as light source units. At this time, the laser diodes 40 that are defective can be identified by comparing to the list of laser diodes that were judged to be defective, had by the controller 75.

Example

The present invention is described below in further detail by presenting a specific example.

A light source unit bar 71 was fabricated, on which 81 end surface emission type laser diodes which are the test subject are arranged.

The light source unit bar 71 which is the subject of this test was assembled into a burn-in test device as illustrated in FIG. 7, and then the burn-in test was performed. A temperature sensor was inserted in the fixture stand below the installation part of the light source unit bar 71, and the temperature of the fixture stand was measured.

Naphthalene-based oil (product name: EXXSOL) was used as the insulation liquid. 81 laser diodes and 81 photodiodes were immersed in the insulation liquid. The test was to confirm the temperature rise. Therefore, the initial setting was low at 30° C. in order to make the effect easy to observe. When the 81 laser diodes were continuously electrified for 18 min., the temperature became approximately 33° C., and thus a small temperature increase of approximately 3° C. was confirmed.

In contrast, for the case of a comparative example that did not use an insulation liquid (i.e., in air), the temperature reached approximately 70° C., a major temperature increase of approximately 40° C.

The effect of the present invention is apparent from the aforementioned test results.

In other words, with the present invention, the burn-in test is performed by electrifying the plurality of light source element while at least the light source elements composed of laser diodes and the like and the light detectors composed of a plurality of photodiodes or the like, for example, for monitoring the light output from each of the plurality of light source elements are immersed in an insulation liquid. Therefore, stable temperature is held in a short period of time, and a temperature that does not deviate with regards to the normal load conditions can be maintained, As a result, a test of selecting good and defective light source unit chips can be performed without causing damage to the elements.

What is claimed is:

1. A method for performing burn-in test, comprising:
   assembling, on a fixture stand, a plurality of light source elements and a plurality of light detectors for monitoring a light output from a corresponding one of the plurality of light source elements; and
   electrifying the plurality of light source elements in a state where at least the plurality of light source elements and the plurality of light detectors are immersed in an insulation liquid, wherein
   the plurality of light source elements are arranged in a row on a light source element arrangement bar, which is a substrate, and
   each of the plurality of light detectors is arranged opposite to an emission surface of a corresponding one of the plurality of light source elements.

2. The method for performing burn-in test according to claim 1, wherein
   the insulation liquid includes physical properties having a transmissivity of 99.9% or higher at a thickness of 1 mm for light with a wavelength between 600 and 1000 nm.

3. The method for performing burn-in test according to claim 1, wherein
   the insulation liquid receives stirring action.

4. The method for performing burn-in test according to claim 1, wherein
   the plurality of light source elements arranged in the row on the light source element arrangement bar are each configured as a light source unit for thermally-assisted magnetic recording that includes a laser diode which is a light source element provided on a unit substrate, by dividing the plurality of light source elements into single units each containing the light source element.

5. The method for performing burn-in test according to claim 1, wherein
   the light source elements are laser diodes, and
   the light detectors are photodiodes.

6. The method for performing burn-in test according to claim 4, wherein
   the laser diode includes an upper electrode and a lower electrode,
   the light source element arrangement bar includes an extraction lower electrode that is electrically connected to the lower electrode of the laser diode,
   a sheet probe for the upper electrode and a sheet probe for the lower electrode are made to respectively contact the upper electrode and the extraction lower electrode, and
   the laser diode is electrified through a pair of the upper electrode and the sheet probe for the upper electrode and a pair of the extraction lower electrode and the sheet probe for the lower electrode.

7. The method for performing burn-in test according to claim 4, wherein
   electrifying the laser diode, and
   measuring an over time change of current supplied to the laser diode that is required to obtain a predetermined light output from the laser diode.

8. A device for performing the method for performing burn-in test according to claim 4, comprising:
   a fixture stand that fixes the light detectors in a configuration opposite to the emission surface of the light source elements;
   a sheet probe set in which sheet probes for upper electrodes and sheet probes for lower electrodes are alternatingly arranged;
   a controller that receives a measurement output from the light detectors, that controls current supplied to the light detector, and that measures the current; and
   a container body that is configured to accommodate the fixture stand and to store the insulation liquid, wherein
   the fixture stand detachably fixes the light source element arrangement bar on which the light source elements are arranged, and
   by storing the insulation liquid in the container body, the light source elements and the light detectors that are attached to the fixture stand are immersed in the insulation liquid.

9. The method for performing burn-in test according to claim 1, wherein
   while electrifying the plurality of light source elements, the plurality of light source elements and the plurality of light detectors are disposed at a predetermined temperature that is maintained higher than an environment temperature, and
   the method, further comprising
   evaluating over time changes of the plurality of light source elements.

10. The method for performing burn-in test according to claim 9, wherein
    the predetermined temperature is 80 degrees Celsius or more.

* * * * *